US010753965B2

(12) United States Patent
Skovenborg

(10) Patent No.: US 10,753,965 B2
(45) Date of Patent: Aug. 25, 2020

(54) SPECTRAL-DYNAMICS OF AN AUDIO SIGNAL

(71) Applicant: MUSIC Group IP Ltd., Road Town, Tortola (VG)

(72) Inventor: Esben Skovenborg, Aarhus V (DK)

(73) Assignee: MUSIC Tribe Brands DK A/S, Risskov (DK)

( * ) Notice: Subject to any disclaimer, the term of this patent is extended or adjusted under 35 U.S.C. 154(b) by 0 days.

(21) Appl. No.: 16/353,338

(22) Filed: Mar. 14, 2019

(65) Prior Publication Data

US 2019/0285673 A1   Sep. 19, 2019

(30) Foreign Application Priority Data

Mar. 16, 2018   (DK) .................................. 2018 70169

(51) Int. Cl.
| | | |
|---|---|---|
| H03G 5/00 | (2006.01) | |
| G01R 23/167 | (2006.01) | |
| H03G 5/16 | (2006.01) | |
| H04S 7/00 | (2006.01) | |
| G10L 25/48 | (2013.01) | |
| H04R 29/00 | (2006.01) | |
| H03G 5/02 | (2006.01) | |
| G10L 25/18 | (2013.01) | |
| H04R 3/04 | (2006.01) | |

(52) U.S. Cl.
CPC ............ *G01R 23/167* (2013.01); *G10L 25/18* (2013.01); *G10L 25/48* (2013.01); *H03G 5/025* (2013.01); *H03G 5/165* (2013.01); *H04R 29/008* (2013.01); *H04S 7/40* (2013.01); *H04R 3/04* (2013.01); *H04R 2430/03* (2013.01)

(58) Field of Classification Search
CPC ...... G10R 23/167; G10L 25/18; H03G 5/025; H03G 5/165
See application file for complete search history.

(56) References Cited

U.S. PATENT DOCUMENTS

| | | |
|---|---|---|
| 4,492,917 A | 1/1985 | Inami et al. |
| 4,612,665 A | 9/1986 | Inami et al. |
| 4,665,494 A | 5/1987 | Tanaka et al. |
| 2003/0009336 A1 | 1/2003 | Kenmochi et al. |
| 2007/0103140 A1 | 5/2007 | Bernard |
| 2008/0033693 A1* | 2/2008 | Andenna ............ G05B 23/0221 702/179 |
| 2013/0100154 A1 | 4/2013 | Woodings et al. |
| 2014/0269202 A1* | 9/2014 | Dugan ................. A01K 29/005 367/131 |
| 2018/0005644 A1 | 1/2018 | Reza |

OTHER PUBLICATIONS

Danish Search Report for application No. PA 2018 70169 dated Oct. 9, 2018, 4 pages.

* cited by examiner

*Primary Examiner* — Simon King
(74) *Attorney, Agent, or Firm* — Seed IP Law Group LLP

(57) ABSTRACT

A method of analyzing and displaying spectral-dynamic properties of an audio signal, including measuring a level over time in multiple neighboring frequency-bands based on the audio signal; calculating spectral-dynamic characterizing values based on two or more statistics of a distribution of the measured levels within each of the frequency-bands; and displaying a graphical representation of the spectral-dynamic characterizing values as a function of frequency.

20 Claims, 13 Drawing Sheets

SPECTRAL-DYNAMICS OF AN AUDIO SIGNAL

CROSS-REFERENCE TO RELATED APPLICATION

This application claims the benefit of Danish patent application No. PA 2018 70169 filed on Mar. 16, 2018, incorporated herein by reference.

BACKGROUND

Technical Field

The present disclosure relates to assessing spectral-dynamics of audio signals.

Description of the Related Art

When working with audio material, such as a sound recording or a music mix, it is often helpful to analyze and display the spectral properties of the audio. Such analyses can support decisions on how to best apply filtering or equalization (EQ) to the audio, either to reduce the level of unwanted components, or to strengthen or clarify desired elements. The spectral properties can be shown for an entire audio file or clip, often as some form of power spectral density (PSD) analysis and plot. Alternatively, a spectrogram can be generated, to show the spectrum of the sound analyzed for a series of short "frames".

The dynamics of the audio—that is, the variation of level over time—can also be useful to analyze and display. For instance, when making decisions about dynamic processing of the audio, generally by employing some type of dynamic compressor. Commonly the dynamics of an audio clip or file is assessed using a simple waveform plot, i.e., amplitude plotted over time. Although such a plot does show especially the amplitude peaks, it tends to look very "grassy" (too much information) and is a poor representation of how dynamic the audio is perceived when listened to. Another fundamental problem with waveform plots, and envelope plots in general, is that they fail to distinguish between the different frequencies in the audio—they consider only one "overall" level at any given time.

Both spectrograms and so-called waterfall plots present the level at different frequencies over time. But both of them present the level per frequency per time-frame, and it is therefore difficult—based on such complex displays—to get an overview of the spectral-dynamics in the recording or music track as a whole. FIG. 1A is an FFT spectrum analysis and FIG. 1B is a spectrogram plot, both based on 30 seconds of an ABBA song, with left and right channel analyzed and shown separately.

When processing the dynamics of the audio, typically with a compressor, often a gain reduction is shown on a meter. The gain reduction is the instantaneous change of level, that the compressor applies—possibly in several frequency bands. However, such meters present no overview or summary of the effect the processing has on the actual audio file.

When combining different types of spectral and dynamic processing, i.e., a chain of processors or effects, each processor will typically display one or more meters which—together with the parameters of the processor—will let the user know what the processor is doing. However, in order to assess the total (spectral-dynamic) effect of the entire chain, the user must first perform an analysis of the input signal, then a separate analysis of the output signal of the chain, and then finally compare the two and try to detect the change by "visual subtraction".

Generally, the kind of processing and analysis described above are two completely separate steps—often different hardware devices or software programs. Therefore, if a certain change in the audio is desired, which could easily be expressed on the displayed analysis, one would need to first adjust the parameters of the processor, then run the analysis again, then review the updated plot and compare it to the previous plot—and likely repeat these steps several times, until the desired effect was realized.

BRIEF SUMMARY

The inventors have identified the above-mentioned problems and challenges related to determining and assessing spectral-dynamic of audio signals, comparing spectral-dynamics of two audio signals and assessing spectral-dynamic impact of audio processing, and subsequently made the below-described disclosure, which may enable and facilitate these tasks.

The disclosure relates to a method of analyzing and displaying spectral-dynamic properties of an audio signal, involving the steps of measuring a level over time, in multiple neighboring frequency-bands within a frequency range of 20 Hz to 20 kHz, based on the audio signal; calculating spectral-dynamic characterizing values SDCV based on two or more statistics of a distribution of the levels, within each of the frequency-bands; and displaying a graphical representation of the spectral-dynamic characterizing values SDCV as a function of frequency.

Summarizing graphically the spectral-dynamic properties of an audio signal, such as a recording or a music track, is valuable when assessing these essential properties, as a supplement to listening to the audio. The disclosure may in an embodiment be especially advantageous in connection with processing the audio with "effects" or audio-processing devices which can change the spectral and/or dynamic properties of the audio.

The audio signal may be, for instance, a mono signal (one channel), or a mono-sum of a stereo signal, or the Side signal (e.g., left channel minus right channel), or a stereo or surround signal (with individual or combined spectral-dynamic characterizing values SDCV). By audio signal is referred to a signal which is generally in the range of about 20 Hz to about 20 kHz.

The audio signal may be in the form of an entire track or audio file, or a shorter clip or segment, or a sliding analysis window of a given duration (i.e., real-time operation).

By spectral-dynamic properties of an audio signal is referred to properties relating to the frequency spectrum of the audio signal, the time-varying level of the audio signal, and the relationship of these two qualities. Spectral-dynamic properties of an audio signal may for example in an embodiment reveal that while the midrange and high-frequency content in a particular audio signal is within a consistent level range throughout the signal, the level of low-frequency content varies greatly. Such analysis is not possible from a level measurement alone, e.g., a loudness or amplitude measured over time, which would just reveal that the overall level varies. It is also not possible from a signal spectrum measurement alone, e.g., an FFT measurement, which could just reveal that the level of the low-frequency content is overall lower than of the midrange and high-frequency content. Even analyzing both a level measurement and a spectrum measurement together, would not reveal that the time-varying overall level and the lower overall amount of bass energy were explained by the bass level being very inconsistent, as several other reasons for the measurement results would be possible. A listening test by an experienced person has so far been the only way to make a qualified judgement of which of the possible reasons was correct.

However, by the present disclosure is provided a consistent and machine-operable method to reveal the spectral-dynamic properties of an audio signal in a quantitative, reproducible and comparable way. The method offers a person controlling an audio processing or editing a highly beneficial and novel possibility to obtain high-level knowledge about the audio signal in a very simple, efficient and manageable way, which was not possible with previous methods. The present disclosure may also make it possible for machines, e.g., audio processors, to use the spectral-dynamic relationship of an audio signal as for example an input parameter, processing threshold or a goal for processing. By the method of the present disclosure, audio signals can be analyzed and compared with respect to their inherent spectral-dynamics, and audio processing can be adjusted and evaluated with respect to spectral-dynamics of an entire signal, which has not been possible before.

By level is referred to any representation of physical level or perceptual level or any derivative thereof of an audio signal, for example levels of an audio signal filtered by a filter-bank (e.g., perceptual) or unweighted (e.g., power) level in the frequency-bands. In a preferred embodiment the level measurement results in values in units of dB, or equivalent.

The measuring of the level over time refers to the level being measured at several times during a given time period, e.g., hundreds of times or thousands of times during a typical music track of 2 to 5 minutes. In some embodiments, the audio signal may be divided into time windows, and the level be measured once in each time window, e.g., by means of FFT analysis; in an advanced embodiment different time windows may be used for the analysis of different frequency bands. The time windows may be overlapping or non-overlapping, and may together cover all parts of the audio signal, or only a part of the audio signal, either scattered over different parts of the audio signal, or consecutive in a part of the audio signal.

The measuring of the level in multiple frequency-bands refers to the level at each time step, e.g., the time window mentioned above, being measured for several individual frequency bands. The time steps may be different for the different frequency-bands, to obtain a suitable time/frequency-resolution. The number of individual frequency bands may be between for example 2 and 250, preferably between 10 and 120, and are selected within the relevant signal bandwidth, typically 20 Hz to 20 kHz. The individual frequency bands are preferably neighboring with or without overlap throughout the relevant spectral bandwidth, with regular or irregular bandwidths for each frequency band, and any band-pass filters or other ways of performing the spectral analysis may be used. In a preferred embodiment, a filterbank of IIR filters is used.

The spectral-dynamic characterizing values (SDCV) are a result of processing the measured levels with respect to the distribution of the measured levels, more precisely with respect to at least two statistics of the distribution of levels within each frequency-band. The distribution of levels may be a function or table based on the measured levels, quantifying the number of measured levels with respect to their level in each frequency band. As this three-dimensional (count, level and frequency) distribution is very difficult to analyze and use for anything consistently, the present disclosure further provides a reduction of complexity to something highly useful by calculating values that characterize the audio signal from the distribution. These values are called spectral-dynamic characterizing values (SDCV) herein. In a preferred embodiment, at least two statistics are calculated from the distribution of levels. The statistics may for example be two or more different percentiles of the distribution, or for example a mean value and a variance of the count of each combination of level and frequency, or other at least two statistical measures or combination of measures.

With the example of percentile statistics, the resulting spectral-dynamic characterizing values (SDCV) may for example describe what range of levels is predominant for each frequency band, and which, typically high and low, levels only appear for a minor amount of time during the audio signal. Thereby the spectral-dynamic characterizing values (SDCV) may, for example, in an embodiment also be able to better describe the above-mentioned audio-signal with varying levels in the low-frequency range and more consistent levels in the higher frequency ranges, as the method of the present disclosure would lead to spectral-dynamic characterizing values (SDCV) showing a broad range of different levels at the low-frequency with an indication of the most common level ranges and the least common level ranges, and showing a narrow range of different levels at the higher frequencies.

As mentioned above, the calculated spectral-dynamic characterizing values (SDCV) of the audio signal are well-suited for further use by machines and/or persons in connection with further processing the audio signal, as they can be illustrated graphically or used directly in computations. In a preferred implementation, the spectral-dynamic characterizing values (SDCV) are displayed graphically in a representation for further use.

The graphical representation of spectral-dynamic characterizing values (SDCV) of the present disclosure provides the highest amount of detail possible of summarized spectral-dynamics of an audio signal while still being comprehensible to a person. Furthermore, the summary representation is independent of the duration of the audio signal analyzed.

The method of the present disclosure may for example be implemented in an audio processor to assess and represent the input audio signal, the processed audio signal, or a combination of both, as described below. Thereby is provided an advantageous audio processor with a novel and inventive way of representing spectral-dynamics of the signals and how the processing affects this. In an implementation, the disclosure may be integrated into a software application program, into which audio processing is also integrated. Such program may advantageously be used for processing and spectral-dynamics analyzing an entire sound file, or a segment thereof, at the time. In an implementation, the disclosure may be implemented as part of a digital mixing console, such that the sound engineer may switch between the spectral-dynamic characterizing values SDCV of different channels of the mixer; this would be a real-time application of the disclosure, i.e., the spectral-dynamic characterizing values SDCV would apply to a period of the most recent part of the audio, e.g., the last 30 seconds or the last 5 minutes, etc.

In another implementation, the method of the present disclosure is implemented in an audio monitoring device separate from the audio processor, for example when a specific audio processor not including the present disclosure is desirable to use for the audio processing. The separate audio monitoring device implementing the present disclosure, may be connected upstream and/or downstream of the desired audio processor, to assess the spectral-dynamics of the input signal, processed signal or both, and thereby for example aid the user in adjusting the audio processor parameters. For audio processors having control inputs or being programmable, the separate audio monitoring device of the present disclosure may further control processing parameters of the audio processor based on user interaction with the graphical representation of the present disclosure, as described in more detail below.

The graphical representation may be displayed on a display of the audio processor or the separate audio monitoring device, or it may be conveyed to a local or remote computer screen, smartphone, tablet computer or other general-purpose device or sound engineering equipment having a display. The display may comprise additional graphical elements such as other kinds of graphical representations of audio properties, measurements, parameters, etc. The graphical representation may also or instead be output to an electronic memory in a data format for later retrieval and display.

The computational resources for carrying out the present disclosure may be provided by a processor dedicated to this task, e.g., a CPU, DSP, etc., or may be shared with the processing unit of an audio processor, a general-purpose computer, a smartphone or tablet computer, etc.

In an advantageous implementation, the measuring a level is based on a running RMS integration of the audio signal in each of the multiple frequency-bands.

In an advantageous implementation, the measuring a level is based on the absolute or squared magnitude of the audio signal in each of the multiple frequency-bands.

An envelope detector may be implemented, for measuring the level of each frequency band, e.g., by means of a low-pass filter or a Hilbert transform, or it may be an implicit part of the filter-bank.

In an advantageous implementation, the multiple frequency-bands have essentially the same bandwidth in octaves.

When essentially the same bandwidth in octaves, e.g., each band being 1 octave, ⅓ octave or the like, is used for the measuring of levels, the resulting measurements and distribution becomes particularly well suited to analyze music and other audio, as compared to for example FFT results. In a preferred implementation, the measuring with essentially same bandwidth in octaves may be performed by a filter-bank analysis based on a constant-Q transform, but a similar analysis could be achieved, for example, based on a bank of suitable FIR filters.

In an advantageous implementation, the multiple frequency-bands have center frequencies and bandwidths determined such that the frequency-bands are essentially adjacent in a frequency interval analyzed.

When a filter-bank is implementing a set of bandpass filters, each of these filters can be characterized by a center frequency and a bandwidth. These parameters may be determined such that each filter has the same degree of overlap with its neighboring filter, e.g., based on the −3 dB frequency response points of the respective bandpass filters or designed so that a combined frequency response of the filter-bank is essentially preserving the energy of the time domain audio signal. Thus, the frequency-bands of the filters would be distributed evenly over the frequency interval, to be analyzed—for example from 20 Hz to 20 kHz.

In an advantageous implementation, the multiple frequency-bands are based on time-frequency resolution optimized bandpass filters.

When measuring a single level in a frequency-band of a signal, i.e., a level corresponding to a certain instant in time, there is a fundamental trade-off between the time-resolution and the frequency-resolution that can be obtained. The finer the time-resolution, the coarser the frequency-resolution— and vice versa. As the present disclosure involves measuring both spectral and dynamic properties of the signal, i.e., related to frequency domain and time domain, respectively, it is critical to strike a proper balance in the time-frequency resolution of the analysis. A preferred implementation may use the Gabor analysis and its Gaussian function as a properly balanced time-frequency trade-off.

In an advantageous implementation, the multiple frequency-bands are based on a critical bandwidth.

In psychoacoustics, the concept of critical bandwidth relates to the frequency resolution of the human ear, relevant to how signals of different bandwidths and levels are perceived. Therefore, by designing a filter-bank to mirror properties of critical bandwidth, a more perceptual analysis can be achieved. In an implementation, the measuring of levels in neighboring frequency bands based on critical bandwidths may for example involve measuring specific loudness incorporating a psychoacoustical model of masking, e.g., measuring the "specific loudness" in Sone units in each band on the Bark scale.

In an advantageous implementation, the multiple frequency-bands are generated and the levels therein are measured, in essentially the same step based on one or more FFT operations.

By utilizing the Fast Fourier Transform (FFT) algorithm a multi-band frequency analysis may be implemented efficiently.

In an advantageous implementation, the two or more statistics of the distribution of the levels comprise one or more statistics selected from the list of a minimum value; a maximum value; a minimum value above an estimated noise floor; a dB-mean value; a power-average value; a deviation from a mean or average value; and a value based on one or more parameters of a parametric probability-distribution fitted to the obtained levels.

In one implementation of the disclosure, a suitable set of statistics of the level distribution would be: an estimate of a minimum, a maximum, and a mean value, and an estimate of a mean deviation on each side of the mean value. That would yield a total of 5 statistics, that could then be represented graphically as 5 contour lines across the frequency bands, that would together summarize the spectral-dynamics. The level distribution may not need to be represented explicitly, if the selected statistics can be estimated "one level at the time", e.g., as a running mean. A parametric probability-distribution may for example be a normal distribution.

In an advantageous implementation, the two or more statistics of the distribution of the levels comprise two or more percentile values.

In a preferred implementation, the values of for example 7 different percentiles could be estimated, for the level distribution of each frequency band. The 7 percentiles, each in the interval 0-100%, would be selected to best characterize typical distributions of the audio signals in question. We consider 'percentiles' equivalent to quantiles, deciles, quartiles, and related measures.

In an advantageous implementation, the two or more statistics of the distribution of the levels are based on a cumulative distribution function CDF of the distribution of the levels.

Statistics based on the cumulative distribution function CDF of the distribution of levels may for example include percentile statistic measures. This is contrary to statistics such as minimum, maximum and mean values, which are not CDF-based.

In an advantageous implementation, the two or more statistics of the distribution of the levels are associated with a probability of occurrence of the measured levels in the audio signal in each of the neighboring frequency bands.

Percentiles, quantiles, deciles, quartiles and similar statistics are based on the probability of occurrence of the measured levels or range of levels in each frequency band. This is different from statistics such as minimum and maximum values, which simply determine consider occurring levels by their value, not their number of occurrences, as long as they appear at least once. With at least two statistics, e.g., probabilities of occurrence of at least two ranges of measured levels, the percentile statistics are also different from statistics based on various kinds of average values, e.g., mean values, as average values are based on the full range of occurring levels, and not describing probability of individual sub-ranges of occurring levels.

In an advantageous implementation, the measuring a level in the multiple frequency-bands, based on the audio signal, includes a subset of time-frames of the audio signal.

The audio signal may be considered a sequence of time-frames. Each time-frame is associated with a certain time interval of the audio signal. The time-frames may be intervals of equal duration, e.g., 50 ms, 1 second, 30 seconds, 2 minutes, etc., or they may refer to logical parts of the audio signal, e.g., a time-frame for each verse, chorus, bridge, etc., each quarter note or measure of a piece of music, or each segment, e.g., interview or song, within a longer program, etc. The time-frames are typically long enough for the signal within each time-frame to be analyzed and produce at least one level for each frequency band, according to the step of measuring a level over time. Preferably, several levels are measured during each time-frame.

Basing the analysis only on a smaller subset of the time-frames constituting a longer signal, i.e., basically not analyzing every audio sample, may still result in sufficiently accurate band-distribution statistics and SDCV. Yet at a significantly lower computational cost. The subset of time-frames to base the analysis on, may comprise contiguous time-frames, i.e., referring to a single consecutive part of the audio signal, or distributed time-frames, e.g., every second or tenth time-frame, randomly selected time-frames, or time-frames selected based on characteristics of the audio signal, e.g., time-frames representing different loudness levels of the audio signal.

In an advantageous implementation, the calculating the spectral-dynamic characterizing values SDCV is based on two or more statistics of a subset of the levels in the distribution.

Reducing the computational complexity in this way, by subsampling the statistics, may be advantageous when employing IIR filters in the measuring, where a reduction cannot be achieved by means of skipping time-frames due to the recursive nature of the filters. The subset of levels may be selected according to the level, the time and/or frequency-band, for example calculating an SDCV based on for example only the louder measured levels, the low-frequency measured levels, or levels measured within a specific time-interval of the audio signal. If a user needs to see an analysis of only a shorter interval of the signal, i.e., "zoom in", such a subset could also be employed. The time-interval determining the subset of measured levels to base the calculation of SDCV on in such an implementation, may preferably correspond to time-frames of the audio signal as described above, i.e., time-frames determined according to time or properties of the signal or its content.

In an advantageous implementation, the graphical representation is furthermore based on a loudness estimate of the audio signal.

In an implementation, the scale on which the SDCV are displayed may preferably be relative to a loudness estimate of the audio signal, or the SDCV themselves may be represented relative to the overall loudness of the track or recording. By performing this type of loudness normalization of the graphical representation, spectral and dynamic details are easier to interpret, because the overall representation does not "move around" with changes in overall loudness—which may otherwise dominate on the display without this kind of normalization.

In an advantageous implementation, the graphical representation is furthermore based on a loudness estimate of the audio signal, the loudness estimate being determined based on the measured levels in multiple frequency bands.

It may be advantageous—for computational reasons—to base the estimate of loudness on the measured levels, rather than on the audio signal itself.

In an advantageous implementation, the graphical representation of the spectral-dynamic characterizing values SDCV comprises an axis in units of dB.

Decibels (dB) are more closely related to how the level of sound is perceived, than for example peak amplitude or power.

In an advantageous implementation, the graphical representation further comprises an indication of a spectrum associated with a selected time of the audio signal.

The spectrum may be the level, at each of the multiple frequency bands, at the selected time. In an implementation the selected time may for example be the current time of playback, or selected by pointing at a time domain representation of the audio signal, or inputting a time. Here, 'current' refers to the most recent set of updated levels, typically the analysis of the most recent time-frame—if the audio signal is analyzed in terms of time-frames, during playback.

When the current or selected spectrum is shown together with the SDCV, the user can visually relate a representation to what is heard at the selected time, e.g., 'now', to a representation of the 'surrounding' track or signal. Thereby questions could be answered, such as: Is the instrument, which sounds very pronounced in a certain frequency band (now), high in level compared to what else is occurring in this frequency band?

Combined and Difference Graphical Representations

In an advantageous implementation, the method is carried out for the audio signal and for a derived audio signal, which is derived from the audio signal, to calculate spectral-dynamic characterizing values SDCV associated with the audio signal and spectral-dynamic characterizing values SDCV associated with the derived audio signal.

The derived audio signal could be derived from the audio signal for instance by means of effects processing, re-recording, or editing. According to the present disclosure, the term 'derived signal' is not to be understood in the strict mathematical sense also known as 'a differentiated signal', but rather refers to an audio signal that is created from an audio signal by exposing it to audio processing or other direct or indirect modification not necessarily involving mathematical differentiation. By having a set of SDCV for both of these signals, they can be compared—advantageously via their respective graphical representation—to easily assess their spectral-dynamic similarities and differences.

In an advantageous implementation, the method comprises a step of processing the audio signal to establish the derived audio signal, where the displaying a graphical representation aids the adjustment of the processing by the spectral-dynamic characterizing values SDCV of the graphical representation relating to properties of the audio signal that may be modified by the processing.

The adjustment of the processing may for example comprise adjustment of one or more parameters of the processing.

In an advantageous implementation, the spectral-dynamic characterizing values SDCV are updated based on the processing the audio signal, by measuring the levels of the frequency-bands, based on a subset of time-frames of the derived audio signal, the subset based on the processing.

By updating the SDCVs for those time-frames where the processing has been most "active", i.e., where it has presumably made the greatest change to the properties of the signal, the updated (subset of) SDCVs may be computed faster than if the SDCVs had been based on the full duration of the audio signal.

Based on the type and parameter-values of the audio processing, it may advantageously be possible to determine a subset of level measurements over time in multiple frequency bands that may be most affected by the audio processing, and thereby only measure this subset again to update the SDCV after the processing has taken place. Various types of parameters of audio processing may limit the affected subset of measurements to certain frequency bands, to certain levels and/or to certain times. Furthermore, some types of audio processing may—as part of performing the processing—compute e.g., time-varying control signals that may indicate where the effect is most "active".

Various types of audio processing are nonlinear, which may require level measurements over time in multiple frequency bands to be performed to achieve a desired accuracy of SDCV. In contrast, other types of audio processing are essentially linear, which may allow updating the previously measured levels or SDCV on the basis of the parameters of the audio processing.

In an advantageous implementation, the spectral-dynamic characterizing values SDCV are updated based on the processing the audio signal, by means of a mapping from parameters of the processing to an estimate of changes needed to determine the updated spectral-dynamic characterizing values SDCV.

In an implementation, the audio processing comprises different filters of various filter types and with various parameters, for example a Parametric EQ with parameters such as gain, frequency and bandwidth. When the processing in this case is implemented as a linear filter, the SDCV could be updated to reflect the processed signal, i.e., derived audio signal, without actually performing a new measuring of the SDCV of the derived signal. Effectively, each of the SDCV values based on the audio signal, i.e., the original signal, are updated according to the frequency response of the Parametric EQ, implemented as a linear filter.

For processing in general, based on various filters, such SDCV estimates may be very accurate. Even for "nonlinear" processing, e.g., dynamic effects, some estimate may be possible to make on the basis of the processing parameters and the original SDCV estimates, i.e., without a new level measurement, and may be useful where accuracy is less important than speed or costs, because the estimate can be obtained significantly faster and/or using significantly less resources.

In an advantageous implementation, the graphical representation is a combined graphical representation comprising a representation of the spectral-dynamic characterizing values SDCV associated with the audio signal and a representation of the spectral-dynamic characterizing values SDCV associated with the derived audio signal.

By displaying a combined representation comprising both sets of SDCVs, for instance the before-and-after processing can be visualized.

For example, two sets of contour lines, corresponding to the two sets of SDCVs, may be displayed simultaneously. Or the combined representation may "overlay" the "normal" graphical representation, i.e., it can be switched on and off in the display.

In an advantageous implementation, the graphical representation further comprises a difference representation, representing a difference between the spectral-dynamic characterizing values SDCV associated with the audio signal and the spectral-dynamic characterizing values SDCV associated with the derived audio signal.

By displaying the difference between the two sets of SDCV directly, the user can easily focus on what aspects have changed.

In an advantageous implementation, the derived audio signal is derived from the audio signal by audio processing, and the difference representation represents a spectral-dynamic effect of the audio processing.

Displaying the difference between the two sets of SDCVs directly will illustrate the spectral and dynamic effect or consequence of the processing on the actual audio signal. By emphasizing the actual change in properties of the signal, even the smallest change in the sound may be visualized—which would otherwise have been hard to detect, both visually and aurally.

Note that the present disclosure may be used with any (one or more) audio processing device—the actual signal processing algorithm does not need to be known in advance—or at all.

In an advantageous implementation, the combined graphical representation or the difference representation is furthermore based on minimizing a difference between the spectral-dynamic characterizing values SDCV associated with the audio signal and the spectral-dynamic characterizing values SDCV associated with the derived audio signal.

A graphical representation of the SDCV may be shifted along the "level" axis, i.e., the axis perpendicular to the axis representing frequency or band; this shifting is equivalent to adding a constant offset to the SDCV.

By thus "shifting" one of the two respective graphical representations underlying a difference representation, the difference representation itself will change. Thus, different "shifts" or different types of normalization may contribute to either emphasize certain types of differences, that may be important for the user to notice—or alternatively, to reduce the visual strength of some aspect that may be less relevant to the application.

In an advantageous implementation, the minimizing a difference is based on minimizing a difference between a loudness estimate based on the audio signal and a loudness estimate based on the derived audio signal.

If the derived signal differs mainly in terms of overall loudness (i.e., a gain was applied as part of the derivation), the spectrum will appear to have changed at all frequencies, by an equal amount (i.e., the gain value). In this case, it may be preferable to display a difference representation or a combined representation, that only shows differences in the respective SDCV aside from overall loudness.

In an advantageous implementation, the minimizing a difference is based on minimizing a graphical distance between a representation of the spectral-dynamic characterizing values SDCV of the audio signal and a representation of the spectral-dynamic characterizing values SDCV of the derived audio signal.

In an implementation, a combined representation may be most informative, when its two underlying graphical representations are combined in a way that minimized the distance between them. Likewise, a difference representation may be based partly on making the displayed difference as small as possible, by "aligning" the two SDCV on which the difference is based, thereby better highlighting a smaller but more specific/localized difference.

Controlling the Audio Processing

In an advantageous implementation, the graphical representation is an interactive representation comprising at least one user interactive element, wherein the user interactive element is mapped to control one or more parameters of an audio processor in response to a user indicating a desired change of the graphical representation by controlling the user interactive element.

The user interactive element of the graphical representation may preferably comprise a graphical user interactive element (e.g., a GUI component) combined with the graphical representation of SDCV of any of the implementations described above. The displaying of the graphical representation may preferably comprise displaying the user interactive element in a user interface which is arranged to receive input from a user related to the user interactive element. In preferred implementations, the user interactive element may for example be controlled by a user by means of a computer mouse, a touchscreen, a stylus pen, a rotary encoder knob, or any suitable input device. In preferred implementations, the user interactive element may preferably comprise graphically indicated handles or other guide elements, e.g., arrows, line styles, etc., to aid the user in controlling it.

According to the disclosure, the control of the interactive element is advantageously mapped to parameters of an audio processor, so that the user by controlling the user interactive element, in effect controls the audio processor. The mapping to parameters of the audio processor may be directly related to graphical features of the user interactive element, or the mapping may involve a conversion from one or more graphical element features to one or more audio processor parameters. For example, in an implementation, a graphical feature of the user interactive element may be a user-adjustable size of the element, which may be mapped directly to a gain parameter of a desired filter of the audio processor. In another implementation, or for a user interactive element related to a different filter of the audio processor, the mapping of a size of a graphical element may involve a conversion to two or more audio processor parameters, e.g., converting the indicated size to control both the threshold and the compression ratio parameters of a dynamics compressor. In preferred implementations, the user interactive elements each have several adjustable features, mapped to several parameters of the audio processor.

In an advantageous implementation, each of the user interactive elements is associated with at least one of the spectral-dynamic characterizing values SDCV.

In some implementations of the disclosure, the interactive element may be associated with one specific SDCV, that is, addressing one specific frequency and one specific level—or specific intervals thereof. The user can thereby point the parameters of the audio processing towards a narrow range of spectral-dynamics to process.

Alternatively, the interactive element may indicate a wider range of frequency and/or level. For example, if the underlying processing is a Parametric Equalizer, the interactive element may indicate that all levels, for a certain frequency interval, are affected by the processing.

In an advantageous implementation, each of the user interactive elements is associated with a certain type of audio processing.

In some implementations of the disclosure, the interactive element may be associated with one specific type of audio processing from the time the interactive element is instantiated. Alternatively, the interactive element may obtain its association with a certain type of processing based on the task it is assigned—by the user—to perform.

In an advantageous implementation, the control of the one or more parameters of the audio processor is based on a mapping from the desired change to the one or more parameters of the audio processor, the mapping depending on the certain type of audio processing associated with the user interactive element.

The disclosure may be used in the context of interactive processing, when the graphical representation contains one or more interactive GUI elements. The user may adjust one or more parameters of an audio processor by directly "interacting" with GUI components in the display. The audio processor will modify some spectral and/or dynamic properties of the audio signal.

This way, instead of (as in prior art) adjusting curves or parameters to describe the processing itself, the current disclosure provides an advantageous and novel way of controlling an audio processor, where the desired result of the processing is described graphically. In an advantageous implementation, the user may simply adjust the displayed graphical representation of the SDCV of the audio signal to look more like the desired result, and the changed graphical features are then mapped to suitable audio processing types and parameters aiming at achieving the desired result as good as possible.

In an advantageous implementation, a derived audio signal is established by processing the audio signal based on the one or more parameters of the audio processor, and updating the graphical representation on the basis of the derived audio signal.

In some implementations of the disclosure, the graphical representation is a combined graphical representation, as described above, combining the analysis of both the audio signal and the derived audio signal. The graphical representation may also be a difference representation, as described earlier.

In an advantageous implementation, the user interactive element is instantiated by a user.

The user may find the need for one or more instances of the user interactive element, and the different types thereof.

In an advantageous implementation, the user interactive element is based on one or more predetermined values of the parameters of an audio processor.

A user interactive element, inserted into the graphical representation of the disclosure, may represent some predetermined parameters of an audio processor. This way, the user may review the parameters in the context of the representation of the SDCV, and may e.g., accept or reject a set of proposed parameters. The user may also fine-tune the parameters, preferably via the interactive element in the graphical representation.

In an implementation of the disclosure, each type of user interactive element is intended for addressing a certain type of "problem" (i.e., a task that can be solved by means of audio processing). For example, when the application concerns processing singing or voice recording, the typical problems may include making the sound clearer, or more airy, or less muddy, or more homogeneous. Each of these examples may correspond to a set of predetermined values of parameters for an audio processor or effect.

In an advanced implementation of the disclosure, one or more of the predetermined values may be adjusted automatically, e.g., upon instantiation of the user interactive element, such that the parameters better fit the audio signal in question. This automatic adjustment is preferably based on one or more SDCV.

In an aspect, the disclosure further relates to a spectral-dynamics assessing unit for analyzing and displaying spectral-dynamic properties of an audio signal, the spectral-dynamics assessing unit comprising at least one audio input and a processing unit and being communicatively coupled to a display, wherein the spectral-dynamics assessing unit is arranged to receive at least one audio signal from the at least one audio input and carry out the method described in any of the implementations above, comprising a method of analyzing and displaying spectral-dynamic properties of the at least one audio signal, the method involving the steps of measuring a level over time, in multiple neighboring frequency-bands within a frequency range of 20 Hz to 20 kHz, based on the at least one audio signal; calculating spectral-dynamic characterizing values SDCV based on two or more statistics of a distribution of the levels, within each of the frequency-bands; and displaying a graphical representation of the spectral-dynamic characterizing values SDCV as a function of frequency.

The spectral-dynamics assessing unit may for example be an audio processor to assess and represent the input audio signal, the processed audio signal, or a combination of both, as described above. Thereby is provided an advantageous audio processor with a novel and inventive way of representing spectral-dynamics of the signals and how the processing affects this. A spectral-dynamics assessing unit may for example be a software application program having audio processing integrated, as well as an implementation of the present disclosure. Another spectral-dynamics assessing unit may for example be a digital mixing console providing the possibility to activate the present disclosure for a specific input channel, or for the mixed output channel.

In another implementation, the spectral-dynamics assessing unit of the present disclosure is an audio monitoring device separate from the audio processor, for example when a specific audio processor not including the present disclosure is desirable to use for the audio processing. The separate audio monitoring device implementing the present disclosure, may be connected upstream and/or downstream of the desired audio processor, to assess the spectral-dynamics of the input signal, processed signal or both, and thereby for example aid the user in adjusting the audio processor parameters. For audio processors having control inputs or being programmable, the separate audio monitoring device of the present disclosure may further control processing parameters of the audio processor based on user interaction with the graphical representation of the present disclosure, as described in more detail below.

The graphical representation may be displayed on a display comprised by the spectral-dynamics assessing unit, or connected to it, for example a local or remote computer screen, smartphone, tablet computer or other general-purpose device or sound engineering equipment having a display and being connected to the spectral-dynamics assessing unit by for example data network, wireless communication technologies, video cables, etc. The display may comprise additional graphical elements such as other kinds of graphical representations of audio properties, measurements, parameters, etc. The graphical representation may also or instead be output to an electronic memory in a data format for later retrieval and display.

The processing unit may be a CPU, DSP or other processor dedicated to the spectral-dynamics assessing unit or shared with the processing unit of an audio processor, a general-purpose computer, a smartphone or tablet computer, etc.

BRIEF DESCRIPTION OF THE SEVERAL VIEWS OF THE DRAWINGS

Various implementations of the disclosure will in the following be described with reference to the drawings where.

DETAILED DESCRIPTION

Spectral-Dynamics of an Audio Signal

Figure 1A:
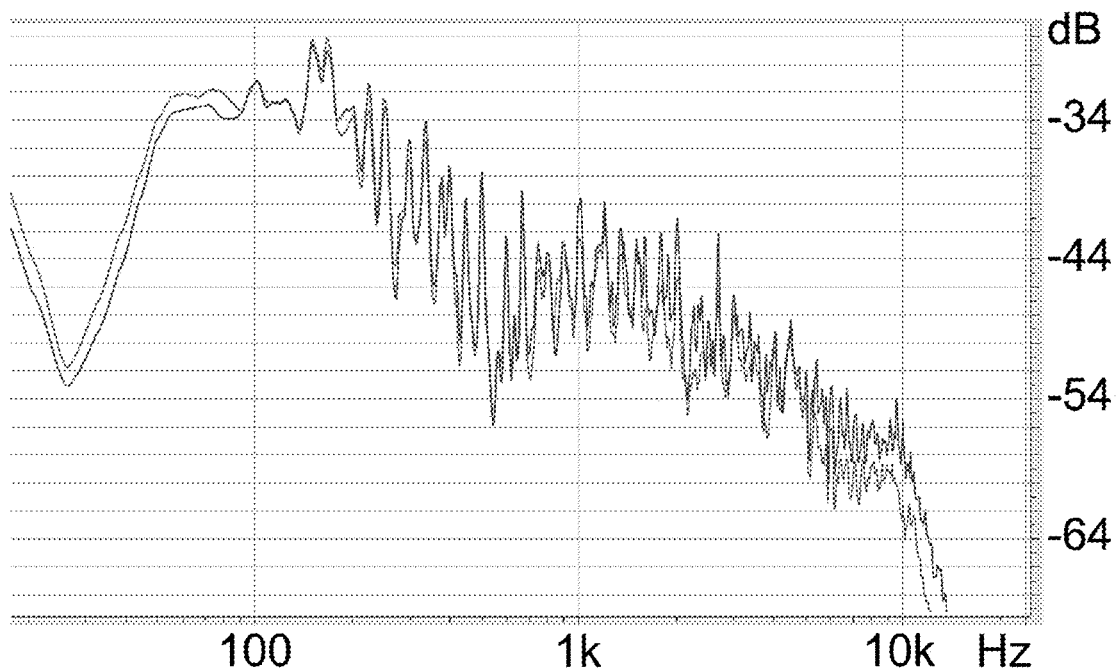
FIG. 1A is a prior art FFT spectrum analysis of 30 seconds of music.
Figure 1B:
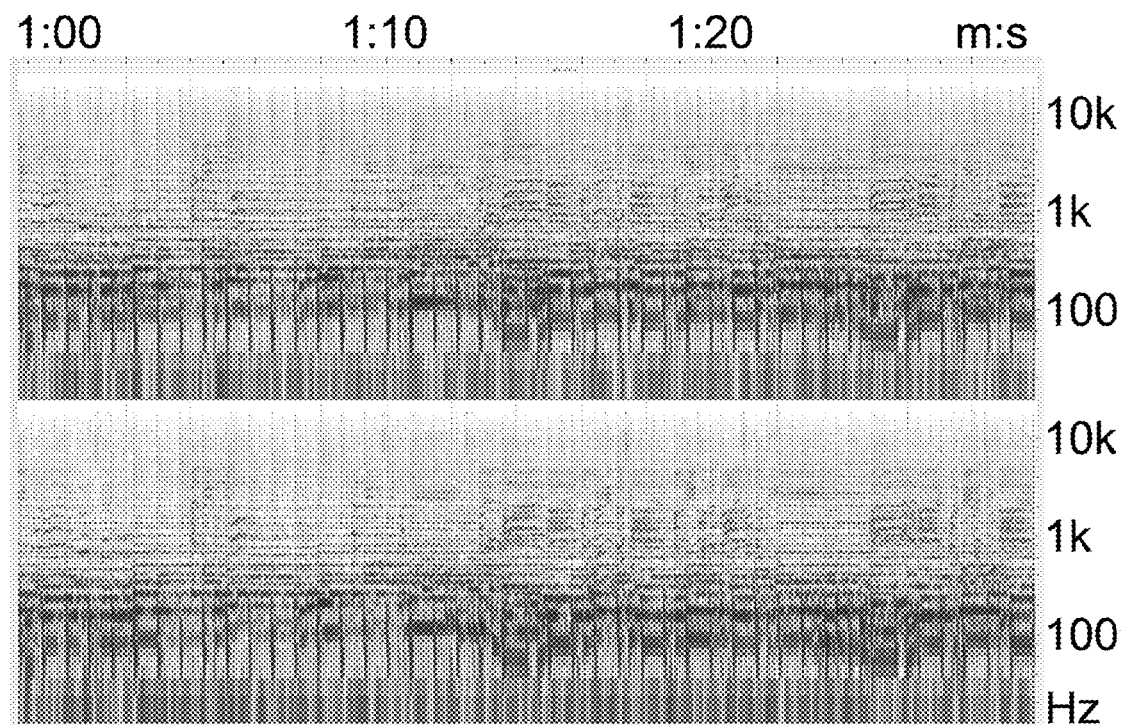
FIG. 1B is a prior art spectrogram plot of 30 seconds of music.
Figure 2:
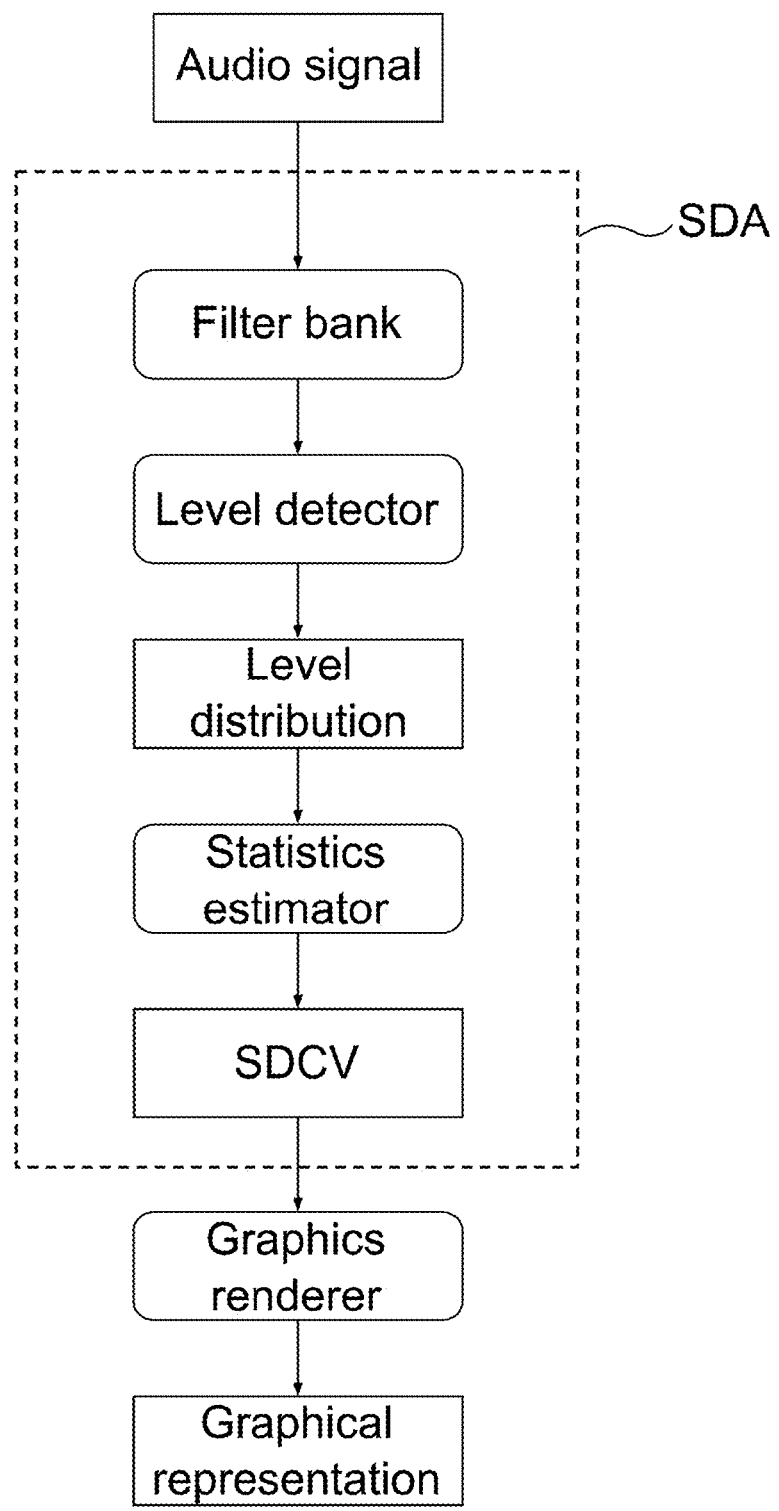
FIG. 2 illustrates an implementation of a method of the present disclosure of displaying a graphical representation of spectral-dynamic characterizing values of an audio signal.

FIG. 2 shows a diagram of an implementation of the disclosure. An audio signal, such as a recording or a music track—or a segment thereof—is used as input for a spectral-dynamic analysis (SDA). The audio signal may be, for instance, a mono signal (one channel), or a mono-sum of a stereo signal, or the Side signal (e.g., left channel minus right channel), or a stereo or surround signal (with individual or combined analyses).

The method of spectral-dynamic analysis (SDA) consists of:

a filter-bank, to split the signal into multiple neighboring frequency-bands;

a level detector, to measure a level over time in each frequency band;

a level distribution for each band is then formed based on the measured levels;

a statistics estimator calculates two or more statistics, based on each level-distribution;

resulting, when combined, in a set of spectral-dynamic characterizing values (SDCV).

Note that some of the above steps may be combined. For example, if the filter-bank is implemented as a sort of spectral analysis which results in a magnitude spectrum, the level-detector is implicitly a part thereof. Analogously, the level distribution can be represented explicitly, e.g., estimated as a parametric distribution or as a histogram, or exist implicitly as part of the statistic estimator, e.g., a running mean, receiving the levels-over-time as input, though it is a function of the level distribution.

Based on the spectral-dynamic characterizing values (SDCV), the graphics renderer will generate a Graphical representation. The rendering process may involve different types of scaling or normalization-functions (described later), and visually associate related frequency bands (e.g., octaves) and/or highlight dynamic tendencies, e.g., by means of level-contour lines (described later).

The level over time detected by the level detector or implicitly by for example a spectral analysis, may be any physical level or perceptual level, for example based on RMS, absolute or squared magnitude, an envelope detector, etc. The level is preferably measured in units of dB, or equivalent. The level is measured at several times during a given time period, e.g., hundreds of times or thousands of times during a typical music track of 2 to 5 minutes.

The level is measured in each of multiple neighboring frequency bands, so that in each frequency band the level is measured over time. The number of individual frequency bands, and how they are distributed over the total signal bandwidth of for example 20 Hz to 20 kHz, may be selected with regard to the desired level of detail of the resulting graphical representation. For example, between 10 and 120 neighboring frequency bands are defined, with regular or irregular bandwidths for each frequency band, for example by defining an equal number of frequency bands in each of the 10 octaves from 20 Hz to 20 kHz. Band-pass filters or other ways of performing a spectral analysis may be used, for example a filterbank of IIR filters or using the constant-Q transform.

The measuring of a level over time, in multiple frequency bands, may for example be accomplished by passing the output of each bandpass filter in a filterbank to a level detector to measure the time-varying RMS level in that frequency band. Thus, for each frequency band several levels are measured over time. In a preferred implementation this is accomplished by means of performing an FFT analysis for each time window.

In some implementations, the level is measured in each frequency band at each particular point in time. In an advanced implementation, the level is measured more times for some higher frequency bands than others, or measured at different times in different frequency bands. Anyhow, the resulting array of levels comprises a number of levels measured at different times, at different frequencies.

The spectral-dynamic characterizing values SDCV are achieved by processing the measured levels with respect to the distribution of the measured levels, more precisely with respect to at least two statistics of the distribution of levels within each frequency-band. The distribution of levels may be a function or table based on the measured levels, quantifying the number of measured levels with respect to their level in each frequency band.

At least two statistics are calculated from the distribution of levels, to produce the spectral-dynamic characterizing values SDCV. The statistics may for example be two or more different percentiles of the distribution, or for example a mean value and a variance of the count of each combination of level and frequency, or other at least two statistical measures or combination of measures, for example considering minimum and maximum functions, minimum value above noise floor, dB-mean or power-average, deviation from mean or average, etc.

The graphical representation of the SDCV may, with the example of percentile statistics, describe what range of levels is predominant for each frequency band, and which, typically high and low, levels only appear for a minor amount of time during the audio signal. Thereby the spectral-dynamic characterizing values SDCV may, for example, in an implementation also be able to better describe the above-mentioned audio-signal with varying levels in the low-frequency range and more consistent levels in the higher frequency ranges, as the spectral-dynamic characterizing values SDCV would show a broad range of different levels at the low-frequency with an indication of the most common level ranges and the least common level ranges, and showing a narrow range of different levels at the higher frequencies.

In an implementation the amount of processing is reduced by only performing the method on a subset of the audio signal, for example contiguous time-frames, i.e., referring to a single consecutive part of the audio signal, e.g., a chorus or verse, beginning, middle or end, etc.; or distributed time-frames, e.g., every second or tenth time-frame, randomly selected time-frames; or time-frames selected based on characteristics of the audio signal, e.g., time-frames representing different loudness levels of the audio signal, e.g., performing an analysis at a few loud segments, and at a few quiet segments.

Alternatively, or in addition, the amount of processing is reduced in an implementation by only calculating SDCV from a subset of the measured levels. The omission of levels from the SDCV calculation may be achieved in several ways depending on the desired result, for example by only calculating SDCV from levels from certain frequency bands, or from certain time segments of the signal, or being within certain ranges, etc. Thereby it is possible to for example only view the SDCV graph representation for, for example, the low frequency part of the audio, or the chorus of the audio, or only show the loudest portions, etc.

Example Level-Measuring Filters

Figure 3:
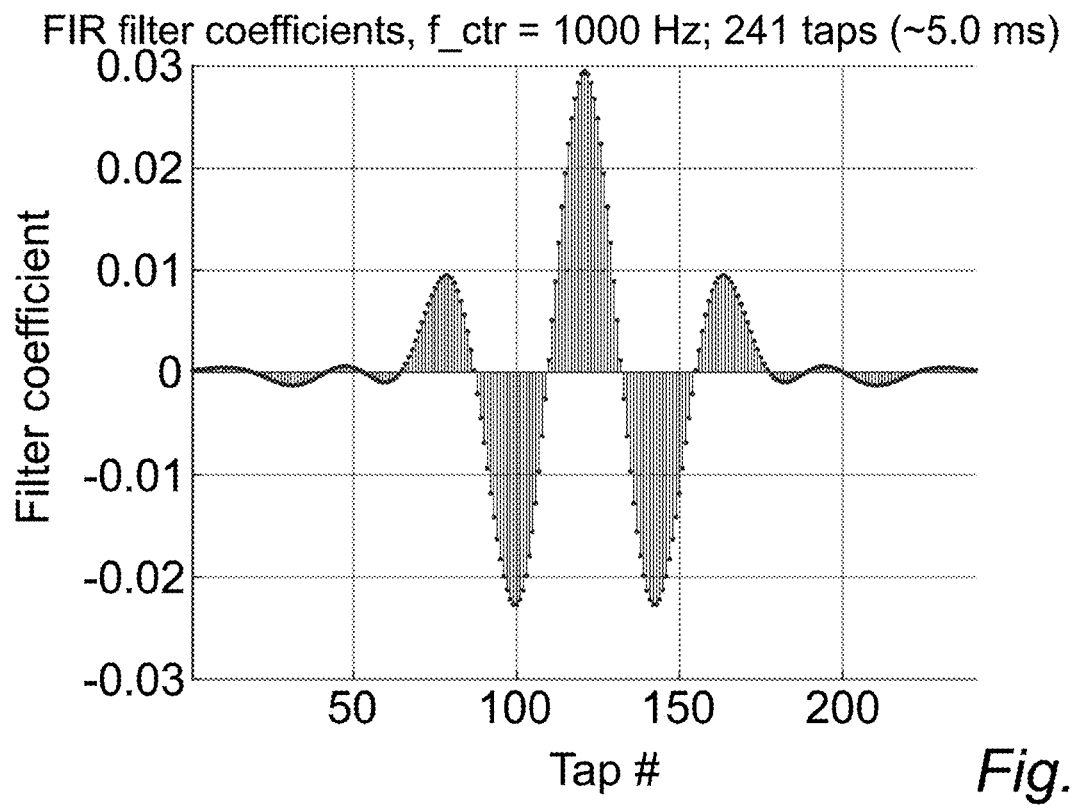
FIG. 3 shows a plot of filter coefficients of a possible implementation of a FIR filter for measuring level over time in multiple frequency bands.
Figure 4:
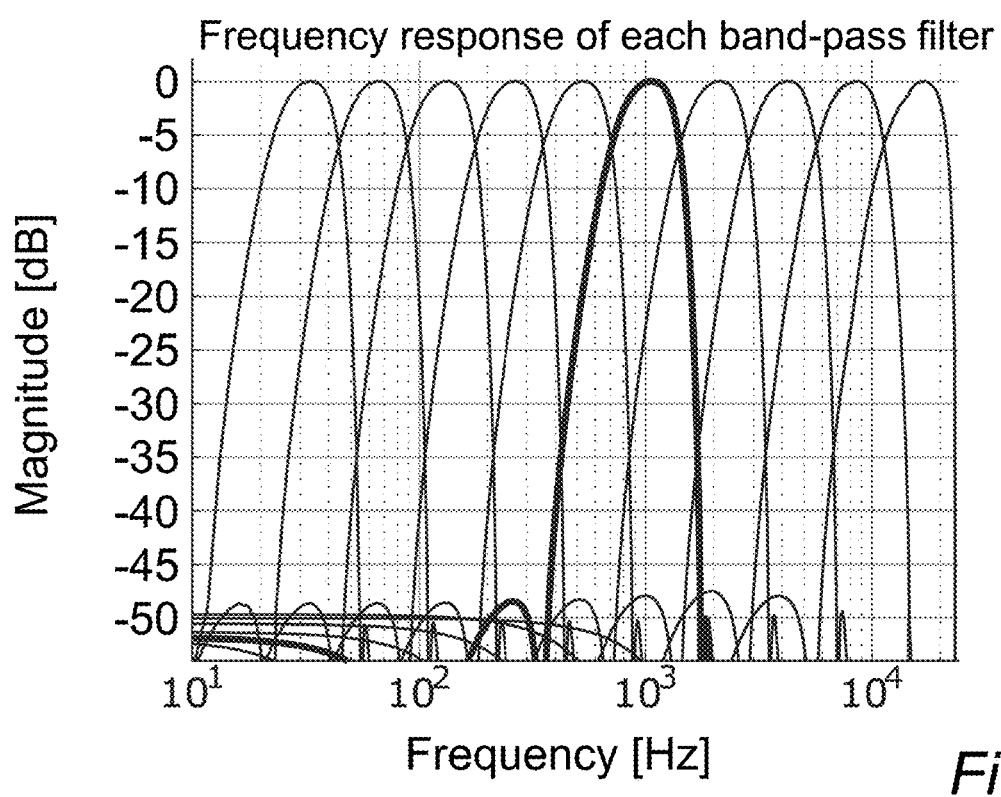
FIG. 4 shows the frequency response of each band-pass filter of the filter implementation of FIG. 3.

FIGS. 3-4 illustrate an example of a set of filters for implementing measuring a level over time in multiple neighboring frequency bands. In one implementation of the disclosure the frequency bands are based on filters each with a bandwidth of 1 octave. When anchored at around 1 kHz, this could give center frequencies for 10 frequency bands in the typical audio range, 20 Hz to 20 kHz, as follows:

$$f\_ctr=[31.3\ 62.5\ 125\ 250\ 500\ 1000\ 2000\ 4000\ 8000\ 16000\ Hz]$$

The bandpass filter for each frequency band could be designed as a FIR filter, using a least-squares approximation to compute the filter coefficients and then smoothing the impulse response with a window. In this implementation a Hamming-window is used.

The number of taps (i.e., coefficients) for the filter in each band (b) is determined by:

$$taps(b)=z*(fs/f\_ctr(b))$$

where a sampling frequency (fs) is used. By this equation all the filters are optimized to meet the same time/frequency criterion, determined here by a constant (z). In this example we choose $$z=5$$

which means that the total length of each bandpass filter equals 5 periods of the center-frequency of that band.

FIG. 3 shows the resulting filter coefficients of the filter of the 1 kHz band, having 241 taps when designed at a sampling frequency of fs=48 kHz. Note that the total length of this particular filter is 5 ms, with the large coefficients covering about half; this corresponds to a reasonably good time-resolution, when analyzing a frequency band with a center-frequency period of 1 kHz, i.e., a period of 1 ms. The same applies to the other frequency bands. Together, these filters form an implementation of the filter bank step of FIG. 2.

FIG. 4 shows the frequency response of the band-pass filter for each band, with the 1 kHz band from FIG. 3 highlighted for clarity. Note that the filters for each of the bands have the same frequency-resolution. Furthermore, all bands have a stop-band rejection of around 50 dB, which is acceptable for some applications.

Suppose a mono audio signal (or a stereo- or multi-channel signal down-mixed or channel-summed to mono): x(t).

Apply the filter-bank of bandpass filters, with coefficients for each band's filter, h(b):

$$x_{fb}(b, t) = \sum_{i=0}^{taps(b)} x(t-i) \cdot h(b, i)$$

Optimizations, such as downsampling between the different steps, have been omitted here for clarity, but may evidently be applied in advantageous implementations, as known to the person of skill in the art of digital signal processing and filter implementation.

Example Level Calculation

Continuing from the above filter example, or based on any other filtering to separate multiple neighboring frequency bands as evident to the person of skill in the art, a level over time for each frequency band is calculated according to the disclosure, cf. the level detector step in FIG. 2. Various implementations may use different level calculations in accordance with the specific application, the processing requirements, etc.

In the present example, the RMS level of each band is calculated, based on a moving-average type of level measure:

$$x_{rms}(b, t) = \sqrt{\frac{1}{N_b}\sum_{i=0}^{N_b} x_{fb}(t-i)^2}$$

where $$N_b=taps(b)*2/z$$

so that the x_rms is based on integration over the number of samples corresponding to two periods of center-frequency of the corresponding band, N_b.

The calculated levels x_rms(b, t) are, as indicated by the arguments b and t, calculated over time in different frequency bands, such that for each frequency band b, several levels x_rms are calculated for different times t.

Example SDCV Calculation

The Spectral-Dynamic Characterizing Values (SDCV), in this example, consists of five statistics (S1-S5), estimated for the distribution of levels, converted into dB, in each band:

$$x_{env}(b,t)=20 \cdot \log_{10}(x_{rms}(b,t))$$

S1: min(x_env(t))
S2: mean(x_env(t)) for t: x_env(t)<m
S3: mean(x_env(t))=m
S4: mean(x_env(t)) for t: x_env(t)>m
S5: max(x_env(t))

where max(x) refers to the maximum value of the signal x over the time intervals which are analyzed, and min(x) to the minimum value, correspondingly, and m is the mean value of the level over the analyzed time interval. In the implementation outlined here, the statistics are calculated directly from x_env, but each statistic S1-S5 is in fact a function of the distribution of levels; the distributions are in this case just never represented explicitly. Hence, in the present implementation, the steps of level distribution and statistics estimator, and resulting SDCV's in the diagram of FIG. 2, are achieved in one step of calculating SDCV from x_env(t).

Note that the statistics are ordered, such that: S1<S2<S3<S4<S5.

The resulting SDCV, in this example, thus contains 5 statistics times 10 frequency bands, in total 50 values.

Two or more statistics should be calculated in each frequency band in order for the resulting graphical representation to represent spectral dynamics of the signal. Several other types of statistics or combinations thereof may be used for the calculation of SDCVs; for example, as mentioned above, any of minimum value, maximum value, minimum value above a noise floor (estimate), dB-mean value, power-average value, deviation from a mean or average value, parameters of a parametric probability-distribution fitted to the obtained levels, percentile values, etc.

In an implementation, a suitable set of statistics of the level distribution may be an estimate of a minimum, a maximum, and a mean value, and an estimate of a mean deviation on each side of the mean value. That is 5 statistics in total, that could then be represented graphically as 5 contour lines across the frequency bands, that would together summarize the spectral-dynamics. In another implementation, for example 7 percentile values selected to best characterize typical distributions of the audio signals in question would be estimated, for the level distribution of each frequency band, thereby resulting in 7 contour lines describing the spectral-dynamics.

Example Graphical Representation of SDCV

For an experiment showing the application of the above example filters, level calculation and SDCV calculation, a test signal of 10 s duration has been generated, consisting of summing 2 signals a) and b):

a) pink noise, based on normal distributed samples, attenuated by 30 dB;

b) 1 kHz pure tone with a level of −20 dBFS for 5 s, and then −10 dB for 5 s.

Figure 5:
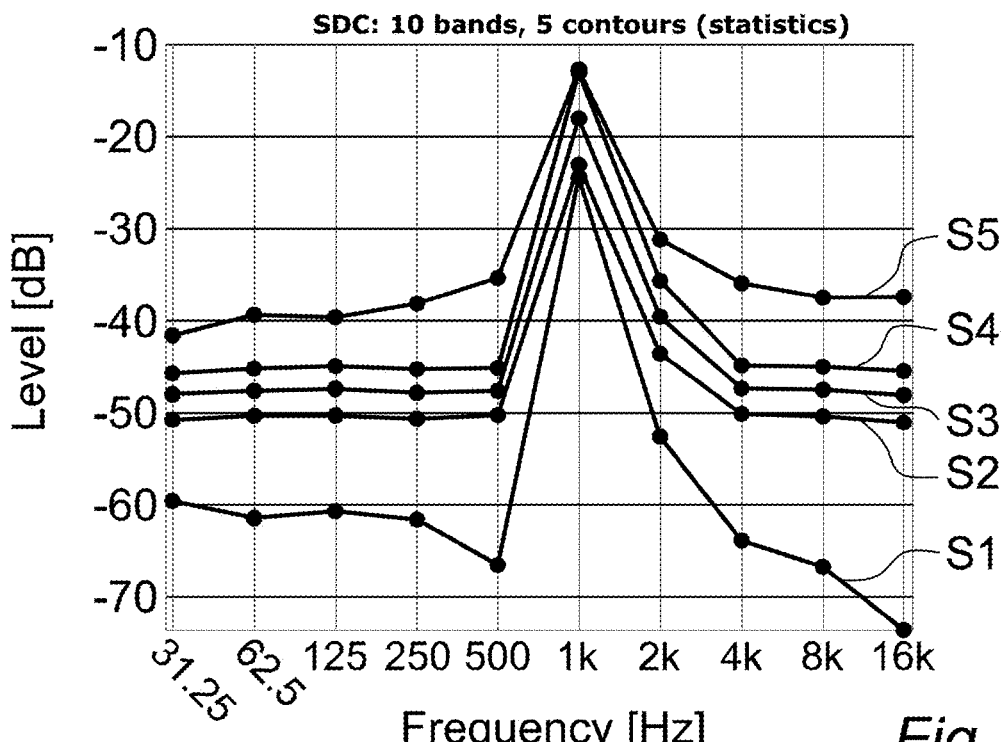
FIG. 5 shows an implementation of a resulting graphical representation of SDCVs calculated from levels of a test signal measured by the filter implementation of FIGS. 3-4.

FIG. 5 shows the SDCV resulting from analyzing this test signal with the filters and method described above with reference to FIGS. 3-4, and the level calculation and 5 statistics S1-S5 described above. FIG. 5 thus illustrates the result of the graphics renderer and graphical representation of the implementation of FIG. 2 applied to the above-described test signal. The graphical representation is here composed of 5 contour lines, corresponding to each of the statistics S1-S5. The graphical representation indicates several spectrum-dynamic characteristics of the test signal, which would not be observable in typical plots like FFT spectrum, waveform, or spectrogram.

According to the selection of statistics S1-S5 defined above, the lowest contour line—S1 in this example—illustrates the minimum level in each frequency band, and the highest contour line, S5, correspondingly illustrates the maximum level in each frequency band. The middle contour line S3 illustrates the mean level in each frequency band, thereby in the present example illustrating that the mean level is nearly the same and around −48 dB for most frequency bands, corresponding to the energy passed by the octave filter for each band.

The remaining contour lines S2 and S4 illustrate the mean level among levels below and above the overall mean S3, respectively. The fact that S2 and S4 are relatively close to S3 in all frequency bands except the 1k band indicates that the signal level of the pink noise component is close to the overall mean level most of the time, as the signal is very homogeneous.

For the 1 kHz band, where the test signal contains a predominant pure tone as well as the weaker pink noise component, the S2 and S4 contours approaches the minimum and maximum contours S1 and S5, respectively, to illustrate that in this particular frequency band, the signal level corresponds to either the minimum level or maximum level most of the time. The 10 dB distance between the S1 and S5 contours correspond exactly to the 10 dB difference between the high and the low level of the pure tone. Together with the indication from the S2 and S4 contours, this shows that the signal level in the 1 kHz band is always above the pink noise, in the background, as seen comparing to the surrounding frequency bands.

A Musical Example

Figure 6:
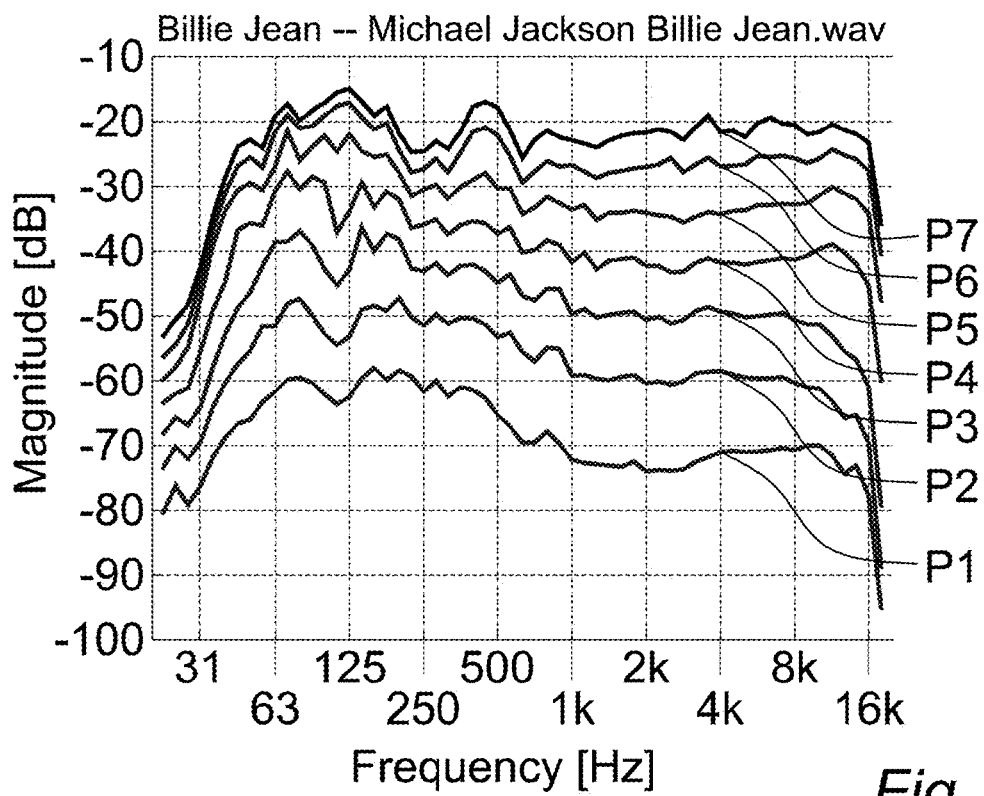
FIG. 6 illustrates a plot of SDCVs of an audio signal according to an implementation of the disclosure.

FIG. 6 shows a different example of implementing and using the implementation of the disclosure illustrated in FIG. 2, this time based on the song "Billie Jean" by Michael Jackson. This is a graphical representation consisting of 7 contour lines, P1-P7, one for each statistic. The statistics of the distribution of levels are in this example 7 different percentiles, specifically:

1% percentile (represented by P1);
5% percentile (represented by P2);
25% percentile (represented by P3);
50% percentile (represented by P4);
75% percentile (represented by P5);
95% percentile (represented by P6); and
99% percentile (represented by P7).

For instance, the 99% statistic is the contour line P7 highest in the plot, corresponding to that level—in each frequency band—that the signal is below 99% of the time.

In this implementation, an FFT-based filterbank was employed with a frequency resolution of ⅙th octave, leading to a total of 60 frequency bands for the 10 octaves covered by the analysis. Thus, both the spectral and the dynamic resolution of this implementation are finer than in the preceding example, which may be more desirable for some applications.

The graphical representation presents a detailed overview of both the spectral properties and the dynamic properties of the entire song. This particular "audio signal" is a highly successful musical production and mix, as evidenced by the SDCV being very evenly spread out. Such findings are easily made when comparing the SDCV of several different songs or signals.

Combined and Difference Graphical Representations

Figure 7:
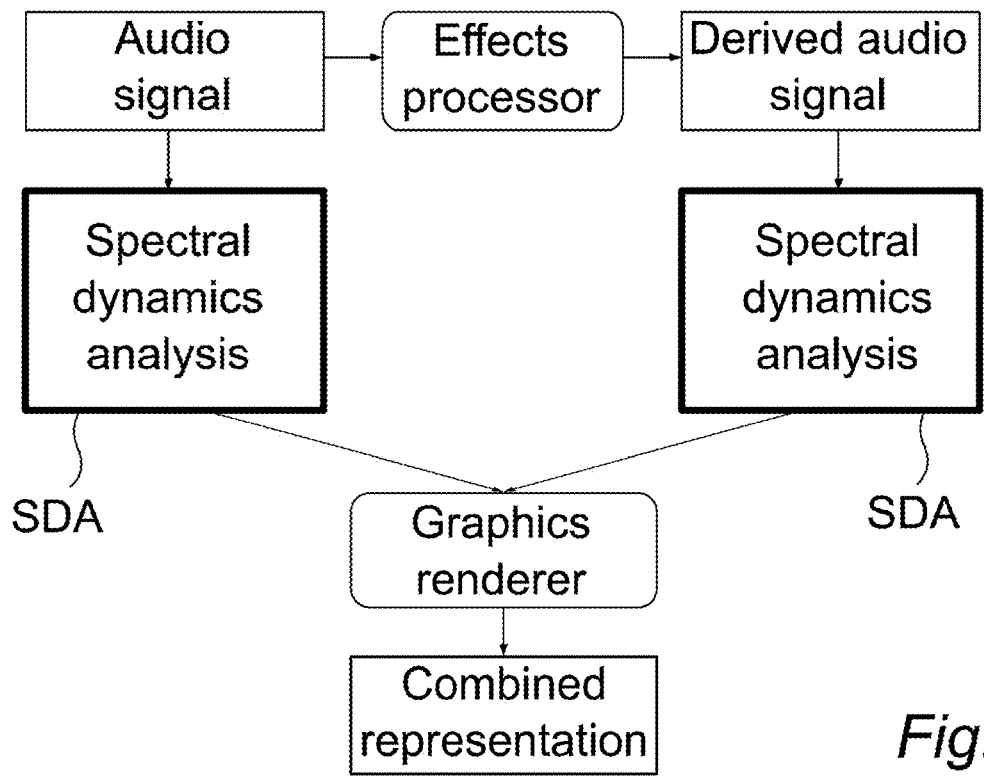
FIG. 7 illustrates an implementation of the disclosure where the method is used for both an audio signal and a derived audio signal to display a combined graphical representation.

FIG. 7 illustrates an implementation of the disclosure where the above-described method is used for both an audio signal and a derived audio signal to display a combined graphical representation. An audio signal, such as a recording or a music track—or a segment thereof—is used as input. As described above, the audio signal may be, for instance, a mono signal (one channel), or a mono-sum of a stereo signal, or the Side signal (e.g., left channel minus right channel), or a stereo or surround signal (with individual or combined analyses).

The audio signal is processed by an effects processor to produce a derived audio signal. The effects processor may perform one or more operations affecting the audio. It could be linear or nonlinear processing, for example equalization, dynamic compression, frequency weighting, amplitude limiting, noise suppression or other basic audio processing or combinations thereof, or other kinds of processing, for example for improving vocals, controlling loudness, adding reverberation, chorus, harmonization, bass, etc.

In the implementation of FIG. 7, a spectral-dynamic analysis (SDA) is performed for both the audio signal and the derived audio signal, to produce a set of spectral-dynamic characterizing values (SDCV) for each of the audio signal and derived audio signal, respectively. The spectral-dynamic analysis SDA may be performed for each signal as described above with reference to any of FIGS. 2-6. The best results are achieved when using the same filter-bank and statistics for both signals, so that the resulting spectral-dynamic characterizing values SDCV are directly comparable.

A graphics renderer is provided for producing a combined graphical representation from the SDCVs of both signals. The rendering process may involve different types of scaling or normalization-functions (described later), and visually associate related frequency bands (e.g., octaves) and/or highlight dynamic tendencies, e.g., by means of level-contour lines (described later).

Figure 8:
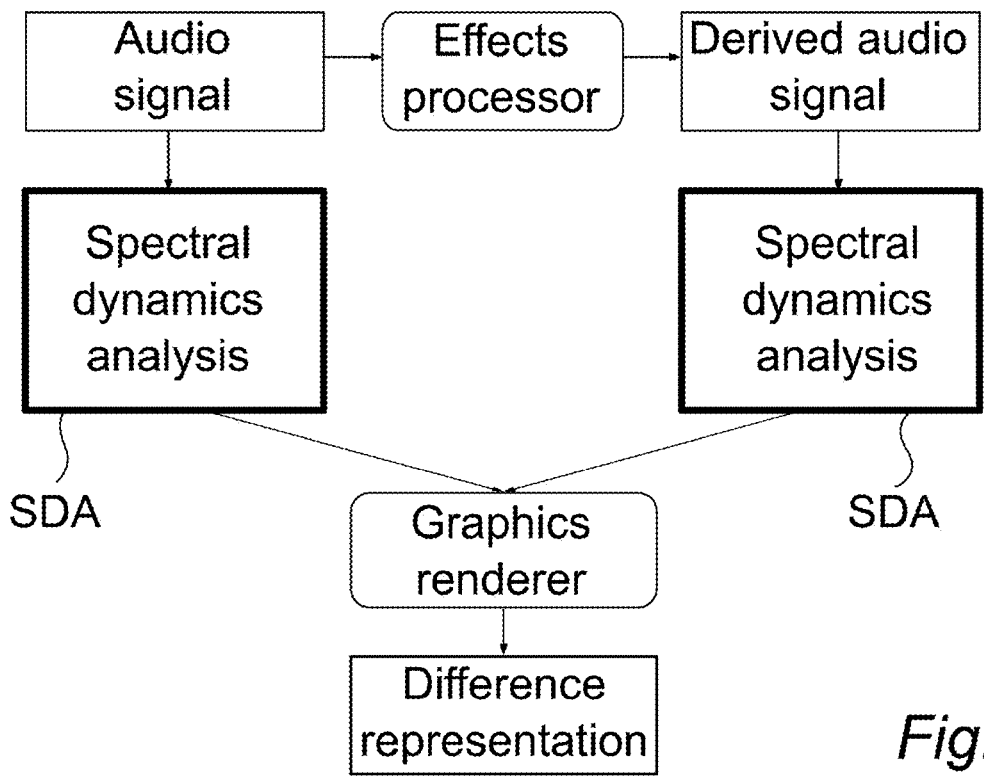
FIG. 8 illustrates an implementation of the disclosure where the method is used for both an audio signal and a derived audio signal to display a difference graphical representation.

FIG. 8 illustrates an implementation of the disclosure where the above-described method is used for both an audio signal and a derived audio signal to display a difference graphical representation. This implementation resembles the implementation described above with reference to FIG. 7, except that the graphics renderer now produces a difference representation. The difference representation illustrates a spectral-dynamic effect of the audio processing performed by the effects processor, and may therefore by very useful in determining how a certain audio processing influences the spectral-dynamics of audio.

In particular when producing a combined graphical representation like in the implementation of FIG. 7 or a difference graphical representation like the implementation of FIG. 8, for example as described below with reference to FIGS. 9-17, the consideration of scaling or normalization-functions may be relevant, to decide which features of the difference between the audio signal and derived audio signal to emphasize.

In an implementation, the method of FIG. 7 or 8 is iterative in the sense that parameters of the effects processor may be adjusted after the first analysis and graphical rendering, thereby leading to a new spectral dynamics analysis of the derived audio signal, and a new graphical rendering. One advantageous use case of the disclosure is indeed a sound engineer using the combined or difference graphical representation of SDCV to understand how a certain audio processing affects the spectral-dynamics of an audio signal, after which the sound engineer may very well wish to adjust the processing to try another processing approach, or just fine tune a parameter.

In such an iterative implementation, the amount of computation, i.e., time and/or resources, to establish the graphical representation may be reduced by not performing a new spectral dynamics analysis SDA of the audio signal but only of the updated derived audio signal. Further reduction of processing resources may be achieved on the basis of the type and value of the audio processing parameters, if available to the spectral dynamics analysis and graphics renderer. For example, knowledge of the type of effects processor and its parameters may indication that the adjustment primarily affects certain frequency bands, certain signal levels, certain time frames, etc. Then the update of the SDCV for the derived signal may be limited accordingly, and the first calculated SDCV be used for presumably unaffected bands, levels or portions of the signal.

In a further advanced implementation of an iterative method based on FIG. 7 or 8, knowledge of the type and parameters of the effects processor may even further reduce the processing requirements for updating the SDCV and graphical representation. In this implementation, the audio effect with the updated parameters is applied directly to the SDCV where possible, instead of performing new level measurements on the derived audio signal. Thereby updated SDCV of the updated derived audio signal are estimated instead of SDA based on measured levels. Such estimation of SDCV based on effects processor parameters is particular effective with linear filtering audio effects, such as for example a parametric equalizer, but may also lead to acceptable results even for non-linear effects, e.g., dynamic effects. In a preferred implementation, the updated SDCV may be estimated at considerable computational speed, and may hence appear near-instantaneous to the user, when adjusting parameters of the audio effect.

Examples of Combined and Difference Graphical Representations

Figure 9:
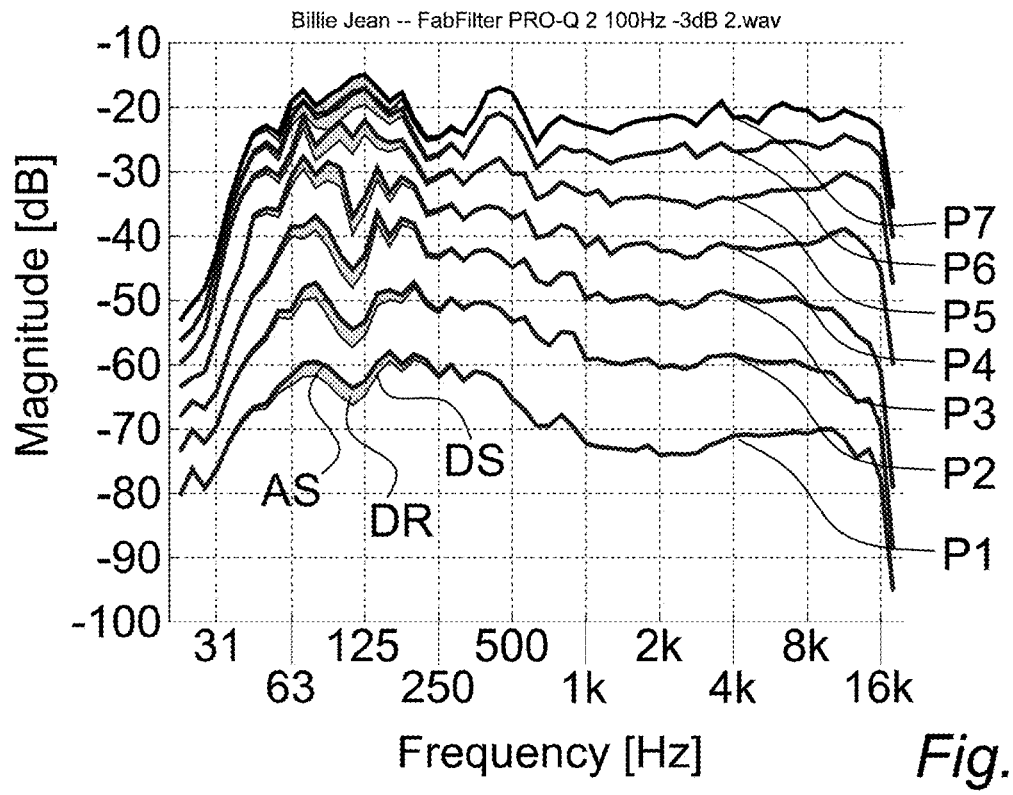
FIGS. 9-10 illustrate example combined and difference graphical representations of SDCV of an audio signal and a derived audio signal processed by a parametric equalizer with different settings.

FIG. 9 illustrates an example of a combined and difference graphical representations of SDCV of an audio signal AS and a derived audio signal DS. The audio signal AS is the same signal as used above for the example of FIG. 6, i.e., the song "Billie Jean" by Michael Jackson, and the spectral-dynamic characterizing values SDCV have been produced the same way as described for FIG. 6, i.e., by a filter-bank of 60 frequency bands over 10 octaves, and using 7 different percentiles of the level distribution as statistics, thereby producing a graphical representation with 7 contour lines.

The derived signal is derived from the audio signal by processing with a parametric equalizer, the FabFilter PRO-Q 2, with a frequency setting of 100 Hz and a gain setting of −3 dB. Both representations of the SDCV for the original signal AS, similar to FIG. 6, and for the derived (processed) signal DS are shown, i.e., combined—and furthermore, a representation of their difference DR is shown. Thus, where the representations based on the audio signal AS and derived signal DS seem coincident in the graph, this is caused by the difference representation DR being too insignificant to be graphically discernible.

In the present example, the SDCV of the audio signal AS are represented with a bold line, the SDCV of the derived audio signal DS with a thinner line, the difference representation DR illustrated by shading the area between the audio signal and derived audio signal. The 7 percentile curves P1-P7 are drawn with similar graphical properties. Several alternative ways of illustrating the SDCVs may be applied in various implementations of the disclosure, for example using colors, partial transparency, or dashed lines to distinguish the 7 different curves, or distinguish between audio signal AS and derived audio signal DS, and using colors or different kinds of shading for the difference representation DR.

The difference representations DR in FIG. 9 clearly show the effect of the processing on the entire music track. At 100 Hz the signal is attenuated by about 3 dB; all levels are attenuated by an equal amount, illustrated by the difference along each of the 7 contours P1-P7 (seen vertically). At frequencies above and below 100 Hz, the attenuation drops to 0 dB, indicating a filter bandwidth of around 1 octave.

Note that the present disclosure can thus reveal in detail what the equalizer has done to the music track, without any prior knowledge of the processing-algorithm or—parameters employed by the equalizer.

Figure 10:
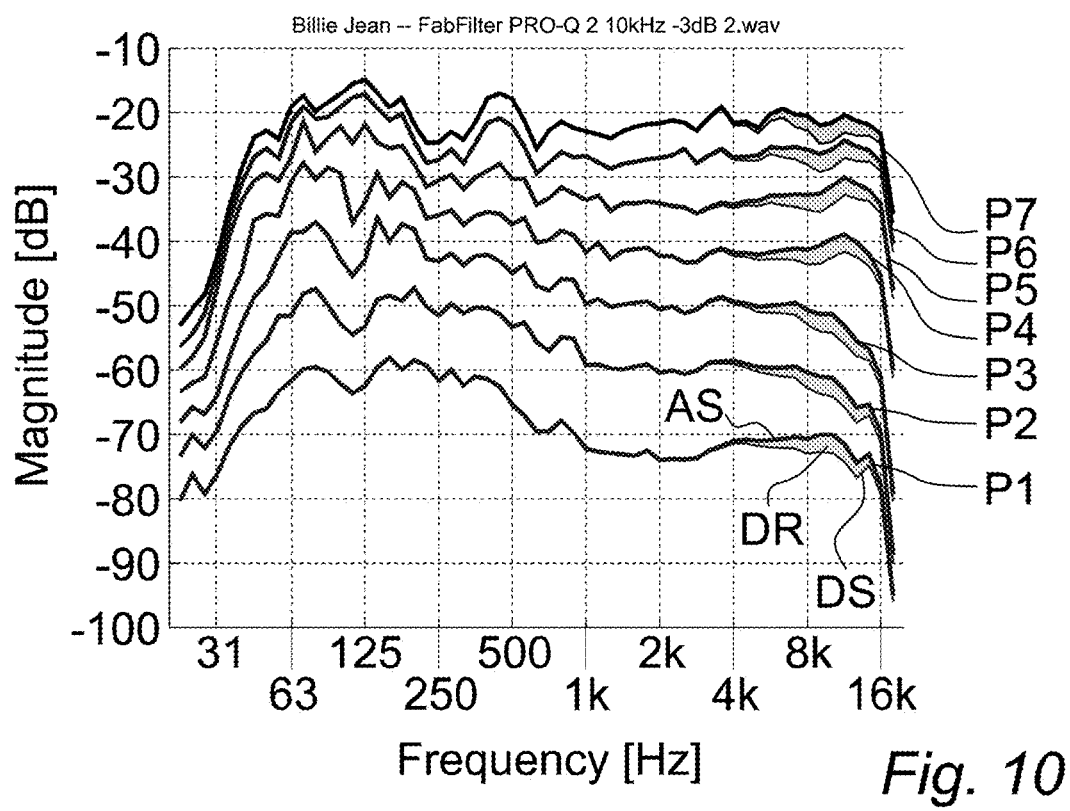

Analogously, the FIG. 10 illustrates processing the same audio signal AS with the same parametric equalizer, this time with a frequency setting of 10 kHz, to produce a different derived audio signal DS. Here, the difference graphical representation DR of the SDCV reveals the attenuation, centered at around 10 kHz. Again the representation shows an equal amount of attenuation across all levels, suggesting that a linear filter, such as a parametric equalizer, was applied in the processing.

Figure 11:
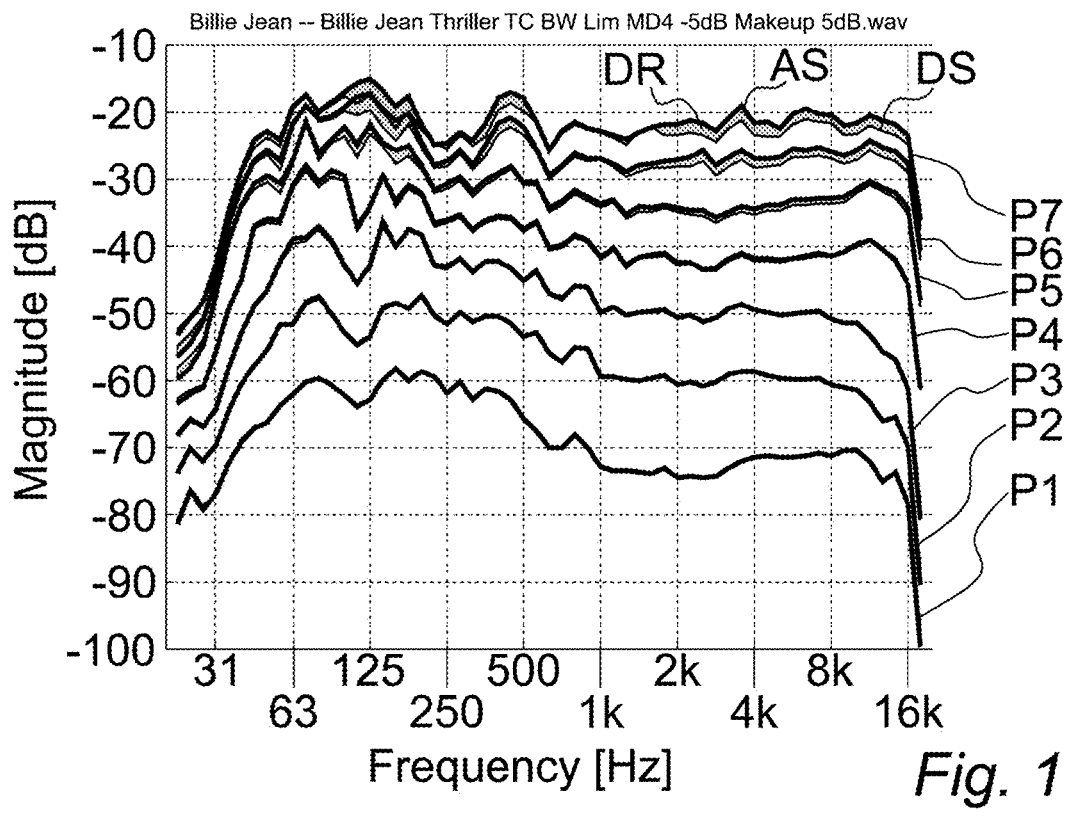
FIGS. 11-13 illustrate example combined and difference graphical representations of SDCV of an audio signal and a derived audio signal processed by a limiter, and respectively without loudness normalization and with loudness normalization.
Figure 12:
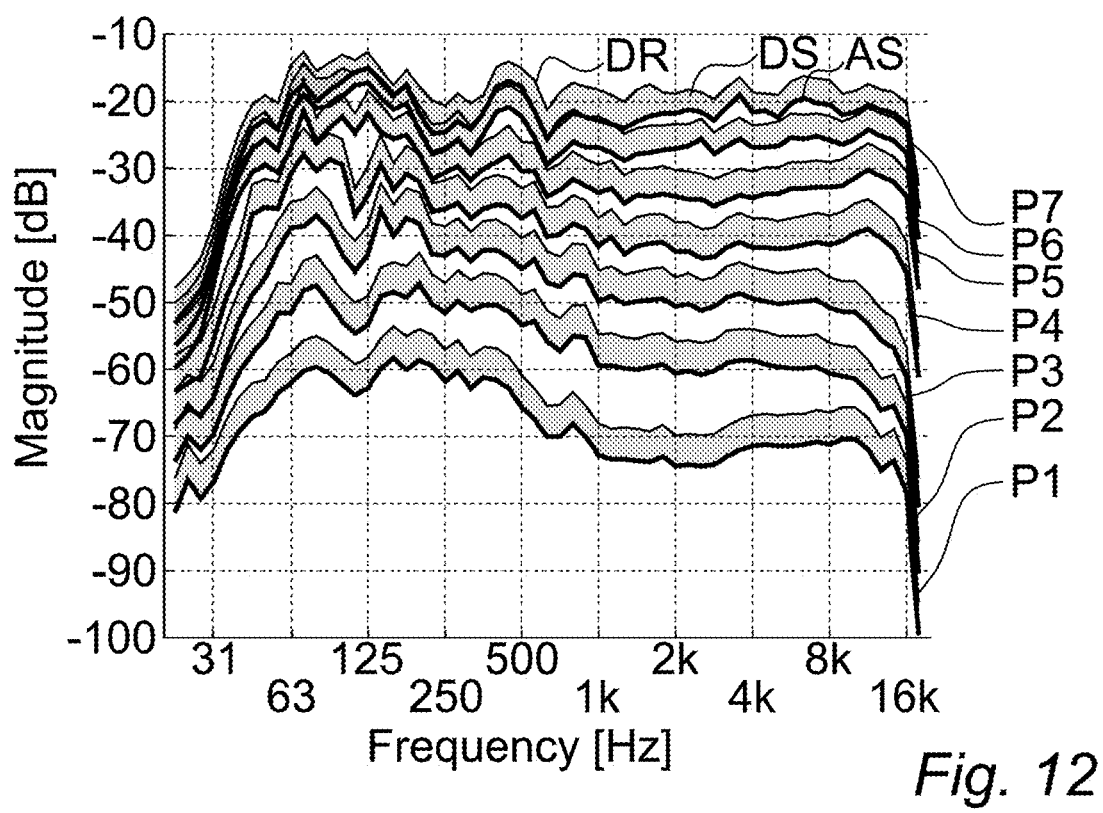
Figure 13:
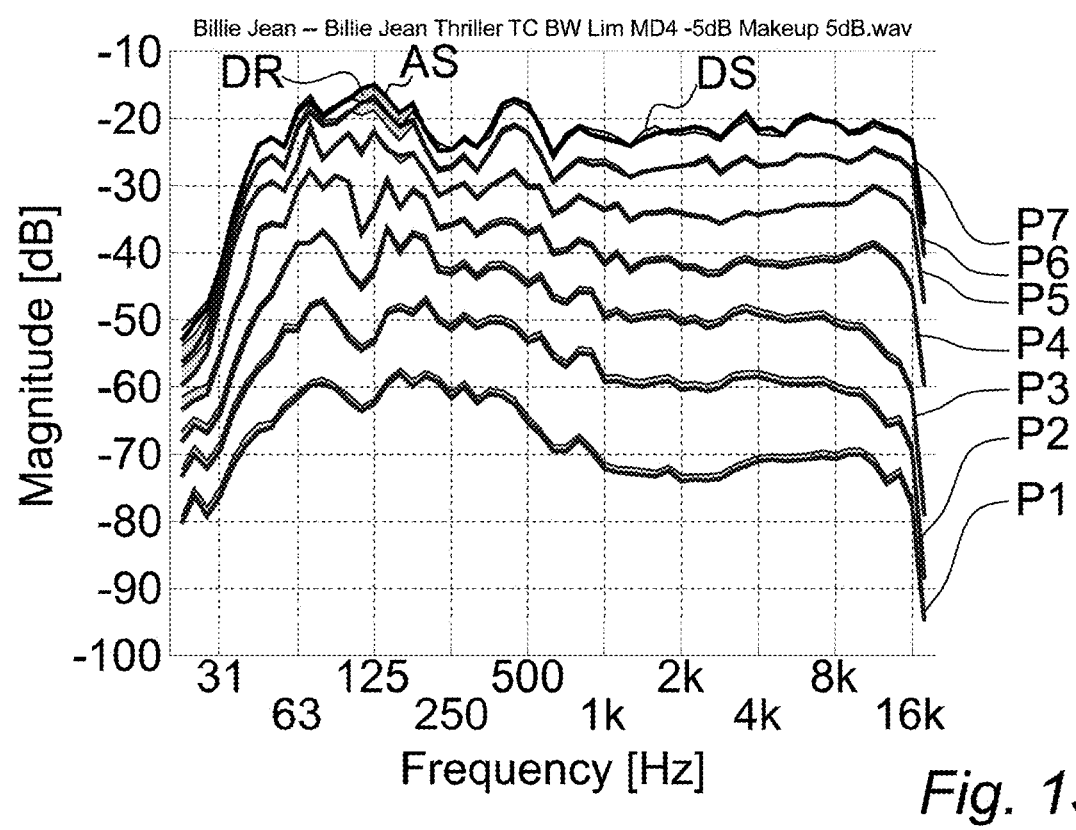

FIGS. 11, 12 and 13 illustrate examples of combined and difference graphical representations of SDCV of an audio signal and a derived audio signal. The audio signal AS was the same as used in the above examples, and the spectral-dynamic analysis was the same as described above with reference to FIG. 6. The derived signal DS was processed by the Brickwall Limiter of the MD4 algorithm by TC Electronic. Such a limiter attenuates levels in the signal above a given threshold level, whereas levels below the threshold are in principle untouched. However, due to time-constants and the dynamic response of the limiter, its attenuation gain changes gradually in order to preserve sound quality. Hence, even levels somewhat below the threshold may be affected as well (by the limiting of preceding higher levels).

FIG. 11 shows that the levels above roughly −30 dB are attenuated by the processing, as seen by the highest two contour lines, P6 and P7. The 2 contour lines below that, i.e., P4 and P5, show that levels in the interval −40 to −30 dB are also affected, but to a smaller extent—indicating the dynamic behavior of the limiter, described above. Note that the levels across all frequencies are affected roughly by the same amount, and low levels are not affected—indicating a limiter has been applied.

FIG. 11 is also an example of minimizing a graphical distance between a representation of SDCV of an audio signal AS and of a derived audio signal DS. In this implementation, the representation of the derived signal DS is "shifted" vertically, to align the contour lines based on AS and on DS as much as possible. The effect of this, in FIG. 11, is that the contour lines P1-P4 of AS and DS seem to overlap completely.

FIG. 12 shows a graphical representation of the same two sets of SDCV as used in the example of FIG. 11. However, in FIG. 12, no normalization or alignment of the SDCV has been applied. Hence this representation reflects the absolute levels of both the audio signal AS and the derived audio signal DS. The considerable amount of the difference representation DR is caused by so-called makeup gain, applied as part of the processing by the Brickwall Limiter. Basically, the limiter will attenuate the high-level parts of the signal, and then apply an amplification "makeup" gain to the entire signal to make it louder, without exceeding the peak level of the original signal.

The downside of the "un-normalized" representation in FIG. 12 is that—in contrast to FIG. 11—the subtle differences between the two signals AS and DS may be masked by the overall level differences, due to the makeup gain, commonly applied.

FIG. 13 shows the SDCV of the same signal and derived signal, as FIG. 11. However, in FIG. 13 loudness normalization has been enabled, that is, the derived signal is adjusted in overall level, such that it is as loud as the original audio signal. Such a loudness normalization is advantageous when comparing the signals by listening. The overall gain of the normalization is reflected in FIG. 13—because the limiter has attenuated the highest levels, the normalization has "turned up" the overall processed signal, i.e., also affecting the lower levels, to compensate for the loss in loudness due to the limiting, as seen in FIG. 13.

Figure 14:
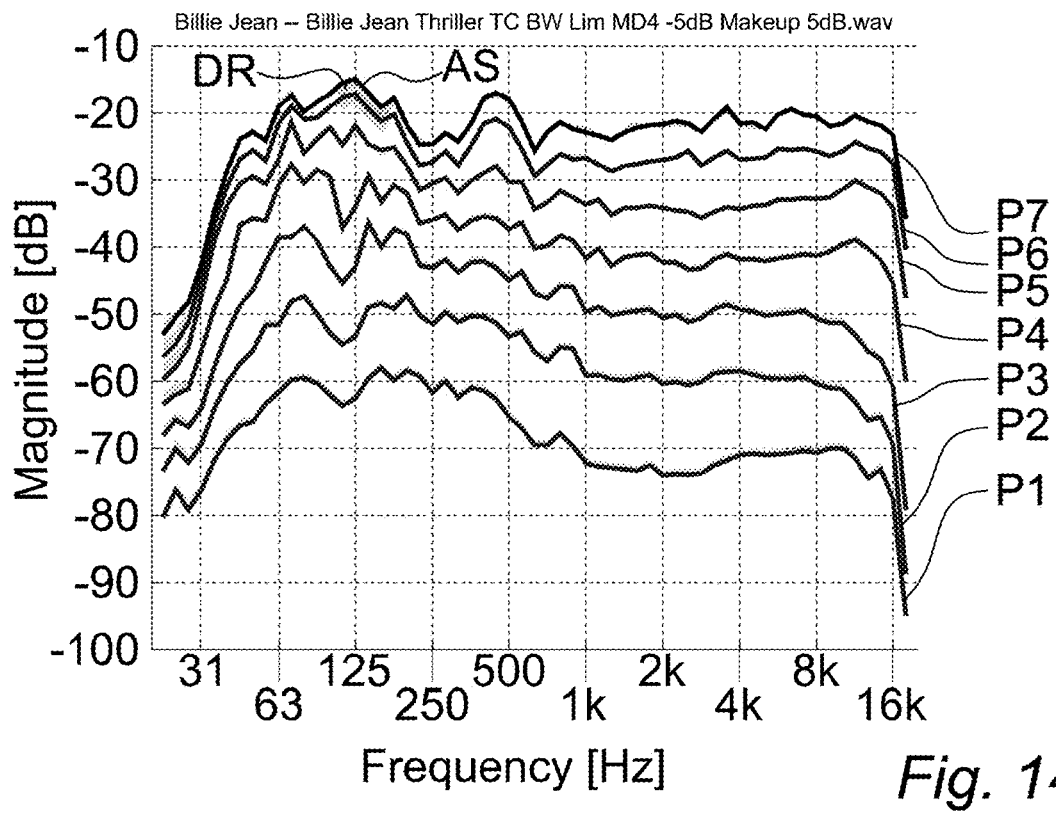
FIG. 14 illustrates an example difference graphical representation of SDCV of an audio signal and a derived audio signal processed by a limiter.

FIG. 14 is analogous to FIG. 13, except that it shows a difference graphical representation DR together with the SDCV of the unprocessed audio signal AS only, i.e., without a combined graphical representation.

Figure 15:
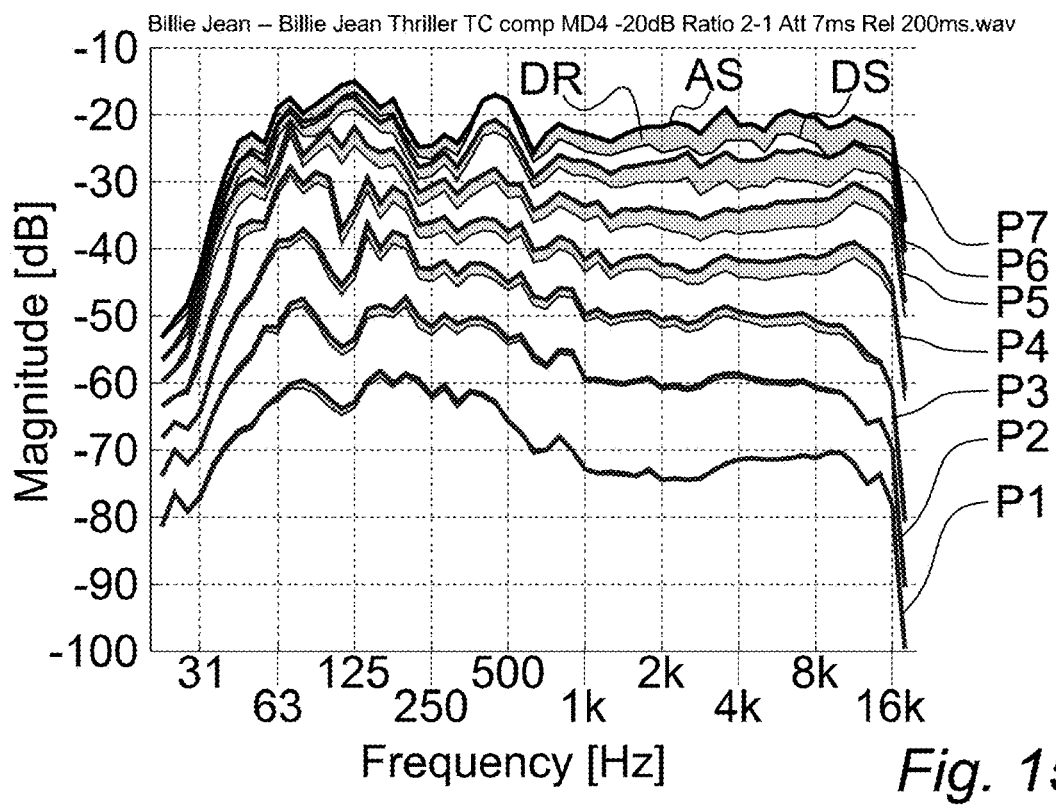
FIG. 15 illustrates an example combined and difference graphical representation of SDCV of an audio signal and a derived audio signal processed by a compressor.

FIG. 15 illustrates an example combined and difference graphical representation of SDCV of an audio signal AS and a derived audio signal DS, with the difference representation DR being shaded. The audio signal AS was the same as used in the above examples, and the spectral-dynamic analysis was the same as described above with reference to FIG. 6. In this example, the derived signal DS was established by processing the audio signal AS by the multi-band compressor of the MD4 algorithm by TC Electronic. The figure shows, that the higher the level, the more attenuation gain has been applied, indicating a dynamic compressor was applied. Furthermore—as opposed to the limiter example of FIG. 11—the difference graphical representation of FIG. 15 shows that different "intervals" of frequency appear to have been processed slightly differently, correctly indicating that a multi-band algorithm was employed.

Figure 16:
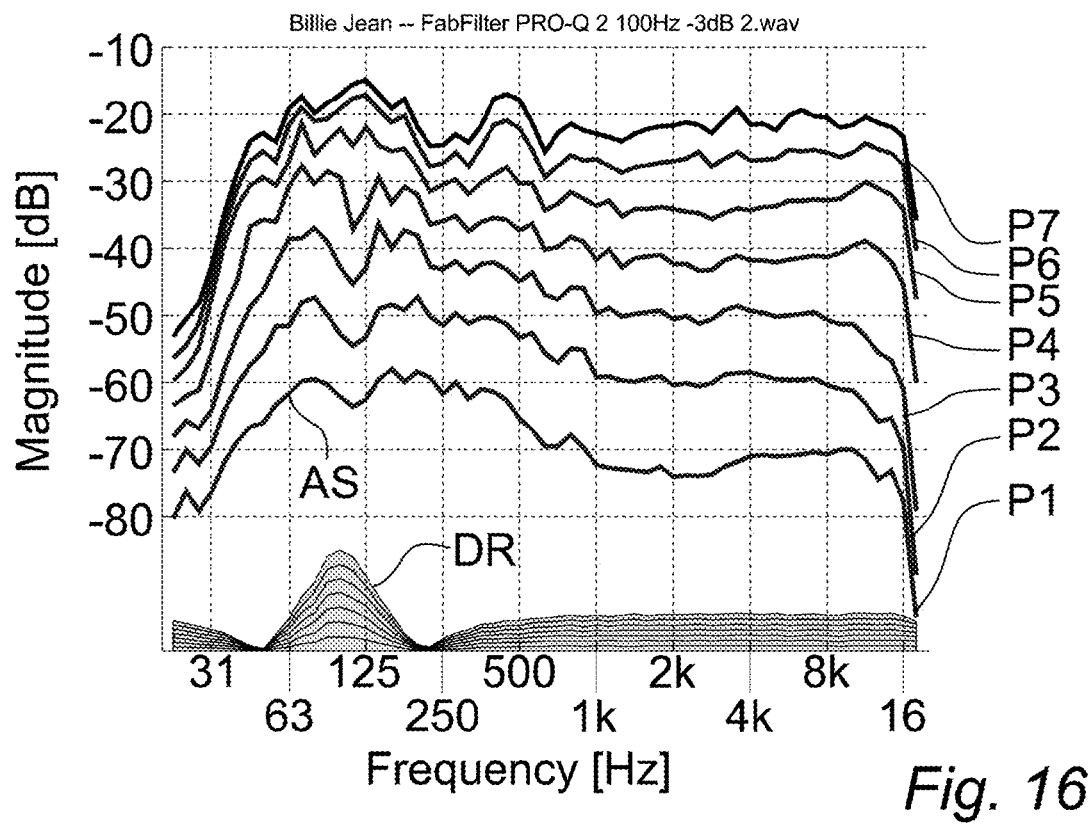
FIGS. 16-17 illustrate example difference graphical representations of SDCV of an audio signal and a derived audio signal processed by a parametric equalizer with different settings.
Figure 17:
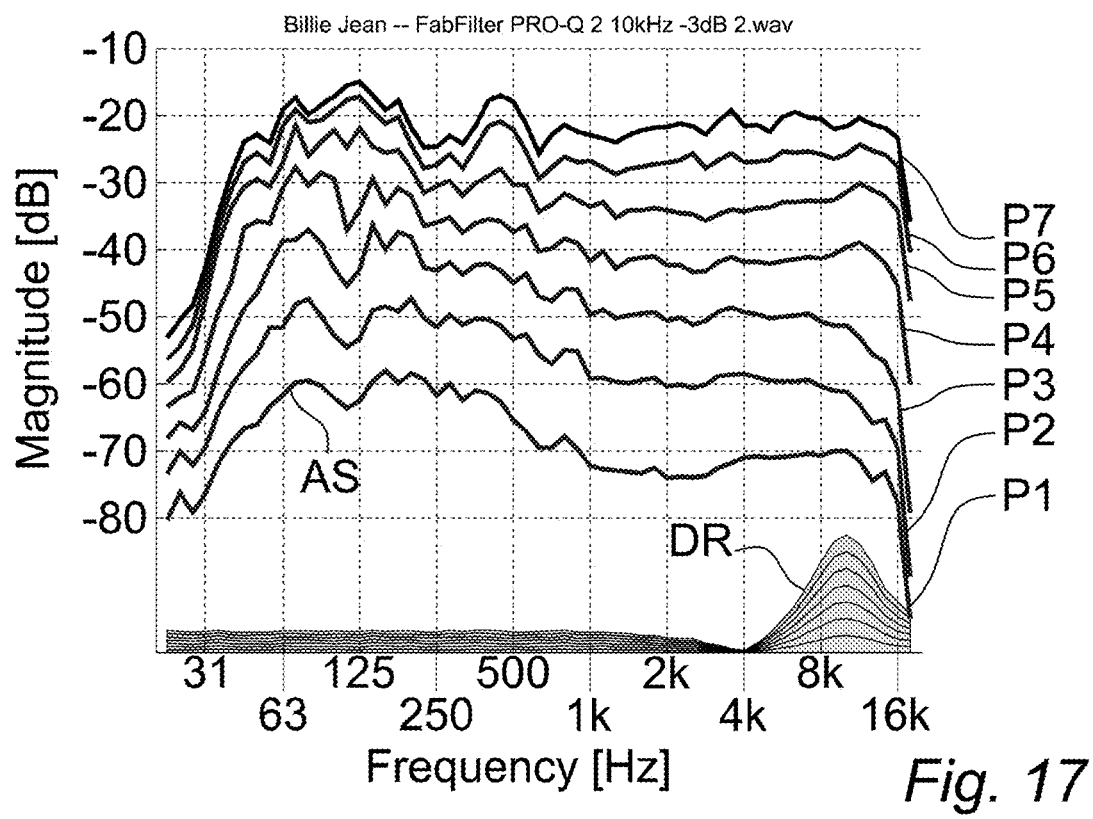

FIGS. 16 and 17 illustrate examples of difference graphical representations DR of SDCV of an audio signal AS and a derived audio signal, processed similarly to FIGS. 9 and 10, respectively. However, in FIGS. 16 and 17 the difference graphical representations DR of the SDCV are shown by themselves, at the bottom of the plot. The area of the difference representation DR is the same as in FIGS. 9 and 10, however the effect of the processing at different frequencies is even clearer, when all the differences, for the 7 level contours corresponding to the 7 statistics, are stacked and shown independently.

Controlling the Audio Processing

Figure 18:
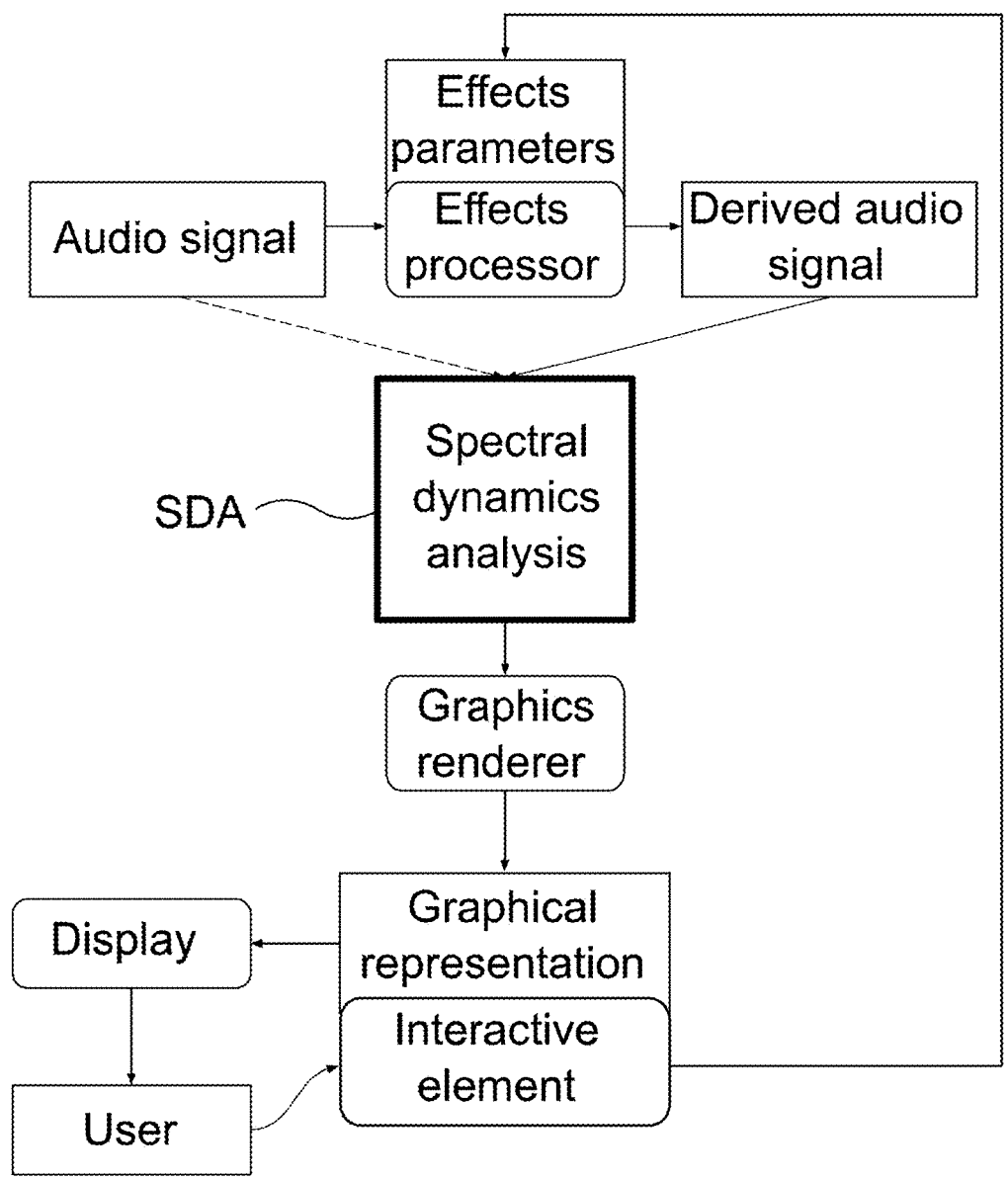
FIG. 18 illustrates an implementation of the disclosure, where the displayed graphical representation of the method of the disclosure comprises user interactive elements that are mapped to processing parameters of the derived audio signal.

FIG. 18 illustrates an implementation of the disclosure where the above-described method is used for both an audio signal and a derived audio signal to display for example a combined and difference graphical representation as described and exemplified above. As above, the derived audio signal is produced by an effect processor based on the audio signal, spectral-dynamics analysis is performed for both the audio signal and derived audio signal as described above, and a graphics renderer establishes a graphical representation of the SDCV of both the audio signal and derived audio signal.

The graphical representation is displayed to a user on a display. In the present implementation, the graphical representation is an interactive representation comprising at least one user interactive element in additional to the SDCV graphs, and whereby a user interface configured to receive user inputs is arranged in correspondence with the display. The user interactive element is mapped to control one or more parameters of the effects processor responsible creating the derived audio signal. In other words, the audio processing generating the derived audio signal may be manipulated via the interactive element.

The user interactive element is preferably a graphical user interactive element overlaid on the SDCV graph, and may be controlled by user input, e.g., by finger or stylus input when the display is touch sensitive, and/or by knobs, wheels, computer mouse, keyboard, etc. In an example, the user interactive element comprises responsive 'handles', i.e., graphical features which are mapped to user input functionality such that the user can move, resize, rotate, skew or otherwise manipulate the graphical interactive element by interacting with the handles.

The implementation of FIG. 18 is preferably iterative, so that an adjustment of one or more user interactive elements causes an adjustment of the effects parameters mapped to the interactive element, and a new derived audio signal is produced based on the adjusted parameters. To the extend required, as explained above for iterative implementations of the methods described with reference to FIGS. 7-8, new spectral dynamics analysis is performed on the new derived audio signal, and in any case the graphical rendering is updated. The user is thereby provided with a graphical representation of the spectral-dynamics effects of the previous adjustments, and may proceed or perform further manipulation of the interactive element, if desired.

In other words, the user in the implementation of FIG. 18 in effect controls the audio processor by controlling the user interactive elements of the SDCV graphical representation.

The mapping to parameters of the effects processor may be directly related to graphical features of the user interactive element, for example a user-adjustable size of the interactive element being mapped directly to a gain parameter of a desired filter of the effects processor. In another example, the mapping of a size of a graphical interactive element may involve a conversion to two or more parameters of the effects processor, e.g., controlling both the threshold and the compression ratio parameters of a dynamics compressor. In an implementation, the user interactive element—in combination with its handles—is designed to graphically suggest to the user the type of parameter(s) it is mapped to.

Any type of effect processing which would affect the spectral and/or dynamic properties of the audio signal may benefit from having one or more parameters mapped to such user interactive elements. Typical effects would be parametric equalizers, dynamic equalizers, adaptive filters, shelving equalizers, split filters, graphical equalizers, de-essers, dynamic compressors, amplitude limiters, multiband compressors, loudness processors, etc.

In an implementation the SDA concerns a Mid/Side representation of a stereo audio signal. In this example, it may also be beneficial to map parameters of any effects to adjust the stereo image of the sound, such as image correcting effects, or spectral panners.

In an advanced implementation, some user interactive elements are targeted specific processing applications, such as reducing low-frequency rumble; increasing vocal clarity; increasing airiness; or strengthening the music's "punch". The user would then instantiate that user interactive element, addressing the specific needs of the particular audio signal, and the user would then be able to fine-tune the effect by adjusting the user interactive element. Such application-dependent user interactive elements may map to parameters of more than one traditional processing block, even though presented to the user as one whole.

In a preferred implementation, the user interactive element is graphically arranged on the SDCV graph in such a way that it indicates which one or more SDCV values it affects. For example, the interactive element may be movably positioned at a specific frequency band to indicate that it affects this frequency band. Likewise, the interactive element may be positioned at specific level to indicate that it affects that level. Correspondingly, the user interactive element may cover or otherwise indicate all frequencies or a broad range of frequencies, and/or all levels or a large range of levels. Further adjustable graphical indications may indicate other parameters, such as gain, threshold, limiting range, time-constants, etc.

The interactive element may also preferably comprise an indication of the type of effects processing it is mapped to, for example parametric equalizer, dynamic compressor, limiter, etc.

In an implementation, the contour lines illustrating the SDCV may also constitute the interactive element themselves, so that the user may manipulate the contour lines, e.g., by dragging a low levels representing curve, e.g., P1 in the above examples, upwards, or pushing a peak of a high levels representing curve, e.g., P7 in the above examples, downwards by using touch or input devices, which gesture may be mapped to for example a compressor gain parameter to amplify low levels in general, or mapped to a parametric equalizer frequency and gain parameters to attenuate specific frequency bands. In this implementation the effects processor can be controlled by first manipulating graphically the SDCV plot until the desired result is illustrated, and then map the result to parameters of the effects controller to the degree possible, to produce the desired result. An update of the SDCV will show how close the resulting effects processing comes to the desired result.

Evidently, not any and all graphically possible manipulation of either separate interactive elements or SDCV curves arranged as interactive elements, can be realized by the given effects processor on the given audio signal. Audio filters and effects impacts frequency bands or levels outside the target frequency or level to some degree. High order filters and complex dynamic equalizers may reduce the undesired impact. In other filters and effects the gradually decreasing impact on surrounding frequencies and levels is, on the other hand, within some extent desirable to make the effect blend in unnoticeably. In an implementation, the degree of manipulation of the interactive element may be limited to correspond to the possibilities of the mapped effects processor, if known. For example, the user interface may be arranged so that it is not possible to graphically drag a handle or curve farther than the corresponding parameter of the effects processor can be set, or the interactive element may be changed to indicate an estimated unadvisable or impossible processing, e.g., by gradually change the color to a warning color, e.g., red.

In a typical workflow, the user may wish to process the audio to affect mainly a certain sonic component, such as an instrument playing particular notes. In this example, the user may loop the playback of the audio of a time region, where the issue is predominant. Even so, it may be difficult to pinpoint exactly what interval of frequencies and levels need to be processed, to address the issue, just by listening. Hence, the graphical representation of the audio signal itself (e.g., FIG. 6), but with SDA concerning only the selected region, may provide a considerable support for selecting the appropriate parameters.

In various implementations, the system may be arranged to transmit to the effects processor and execute all adjustments of interactive elements immediately or after a short idle time, or require the user to indicate when the processing should be updated.

Figure 19:
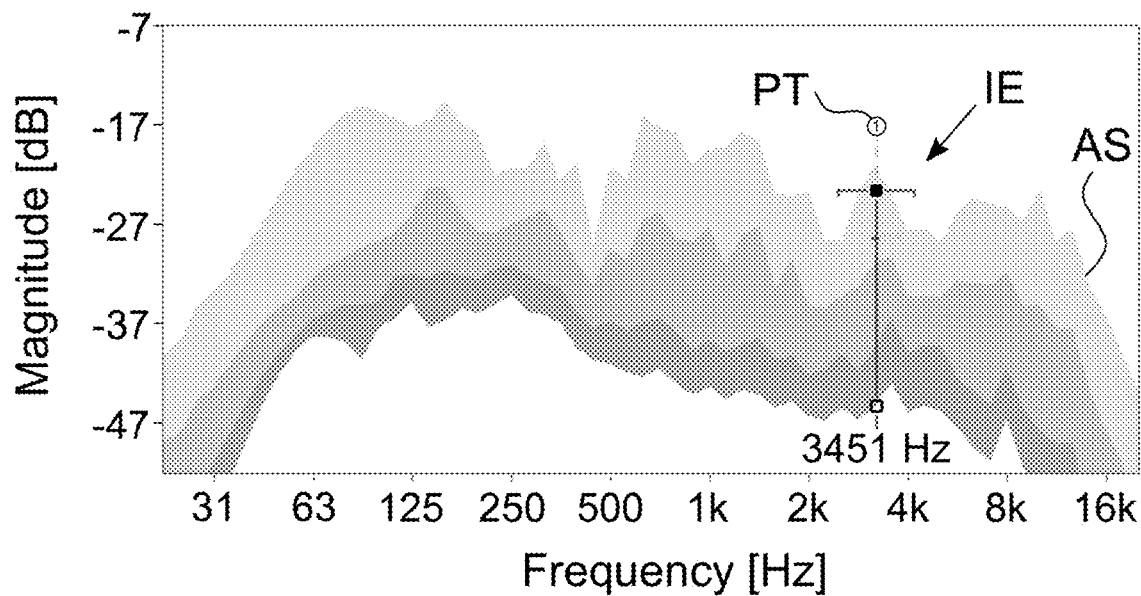
FIGS. 19-21 illustrate implementations of user-interactive graphical elements in a display of SDCVs according to the disclosure.

FIG. 19 illustrates an example of a graphical representation according to the implementations described above with reference to FIG. 18. The graphical representation comprises another variant of a graphical representation of SDCV of the audio signal AS compared to the examples of FIGS. 5 and 6, but any of the above or below, or any other variations, of graphically representing the SDCV is within the scope of the implementation.

The graphical representation of FIG. 19 further comprises an interactive element IE. It is preferably mapped to a specific audio effect of the effects processor, e.g., a parametric equalizer, a compressor, etc. The interactive element may comprise an indication of the associated processing type or instance PT, in this example indicated by a number in a circle, which may correspond to a legend in another part of the user interface. The indication of processing type PT may alternatively be an abbreviation or graphical symbol indicating the audio effect. In the example of FIG. 19, the interactive element with No. 1 as processing type PT, may for example be associated with a dynamic equalizer effect, and having handles or graphical features mapped to processing parameters such as threshold level, makeup gain, compression ratio, center frequency, and bandwidth.

Some of the handles or graphical features for user interactions of the interactive element IE in this example comprise for example a vertical line which may for example indicate a frequency parameter, in this example 3451 Hz, due to its location relative to the frequency axis. A small tick mark with the abbreviation THS at the vertical line may for example be mapped to a threshold level parameter, controlled by its position along the vertical line relative to the magnitude axis. A longer, horizontal line may be used to indicate by its length relative to the frequency axis, a bandwidth of the associated audio effect. The intersection of the horizontal line with the vertical line relative to the magnitude axis and relative to the threshold tick mark may indicate a compression ratio parameter. The position of a small square movable along the vertical line relative to the magnitude axis may be mapped to an output gain or makeup gain parameter of the effect. In this example, the entire interactive element may be dragged horizontally to change the center frequency of the associated dynamic equalizer, while the length of the upper horizontal line may be adjusted to change the bandwidth of its key filter. The upper horizontal line, the threshold tick mark, and the lower square are all movable vertically along the vertical line to adjust the threshold, compression ratio and output gain.

Figure 20:
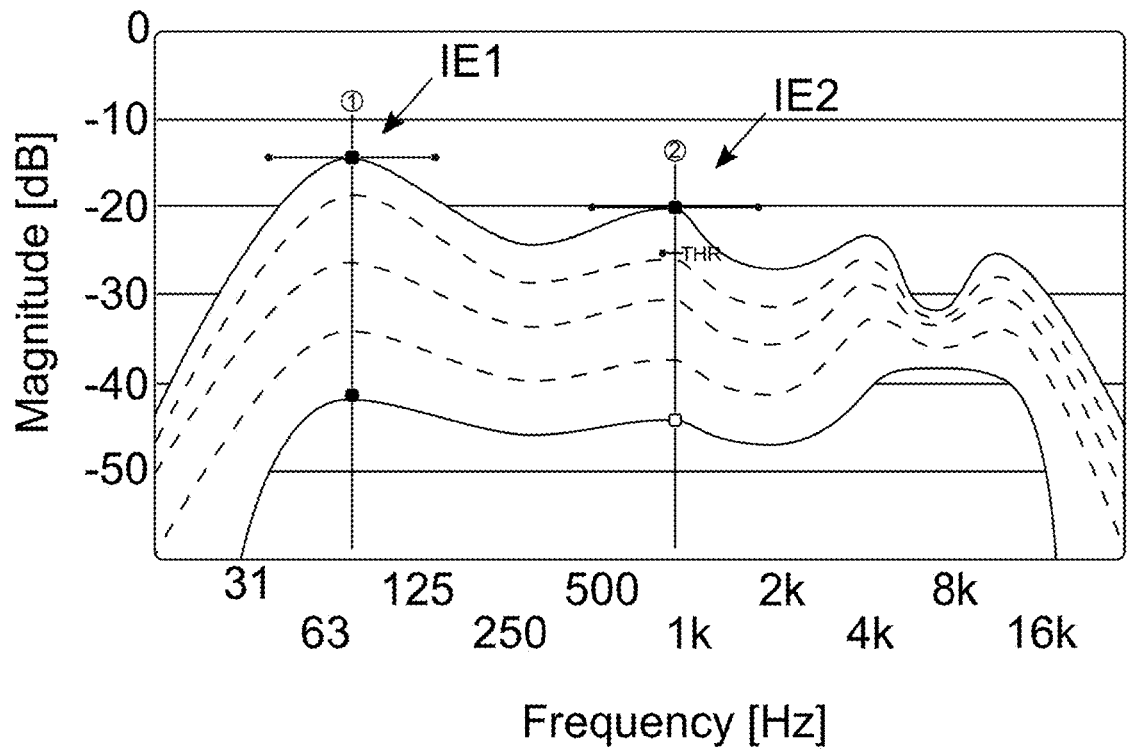

FIG. 20 illustrates a further example of a graphical representation according to the implementations described above with reference to FIGS. 18 and 19. This graphical representation comprises yet another variant of a graphical representation of SDCV of the audio signal AS compared to the examples of FIGS. 5, 6 and 19, but any of the above or below, or any other variations, of graphically representing the SDCV are within the scope of the implementation.

The graphical representation of FIG. 20 further comprises two interactive elements, IE1 and IE2. As described above, they are preferably mapped to specific audio effects of the effects processor. In the example of FIG. 20, the interactive element IE2 with No. 2 as processing type PT, may for example be associated with a dynamic equalizer effect as described above with reference to FIG. 19, and having handles or graphical features mapped to processing parameters such as threshold, compression ratio, center frequency, bandwidth and output gain or makeup gain, as for example described above.

The interactive element IE1 with No. 1 as processing type PT, may for example be associated with a parametric equalizer effect, and having handles or graphical features mapped to processing parameters such as gain, center frequency and Q factor (related to bandwidth). In the example of FIG. 20, the frequency and Q factor may be indicated and adjustable by similar handles as described above for the dynamic eq. The gain of the parametric equalizer may be adjustable by moving the horizontal line vertically, relative to the magnitude axis. The lack of the threshold handle in IE1, as opposed to IE2, immediately indicates to the user, that IE1 is not a dynamic effect but rather a linear filter, such as a parametric eq. Moreover, the 2 black squares in IE1 may be linked, such that they move together, when adjusted vertically. This underlines, that such type of effects will affect all levels—high or low—equally.

Figure 21:
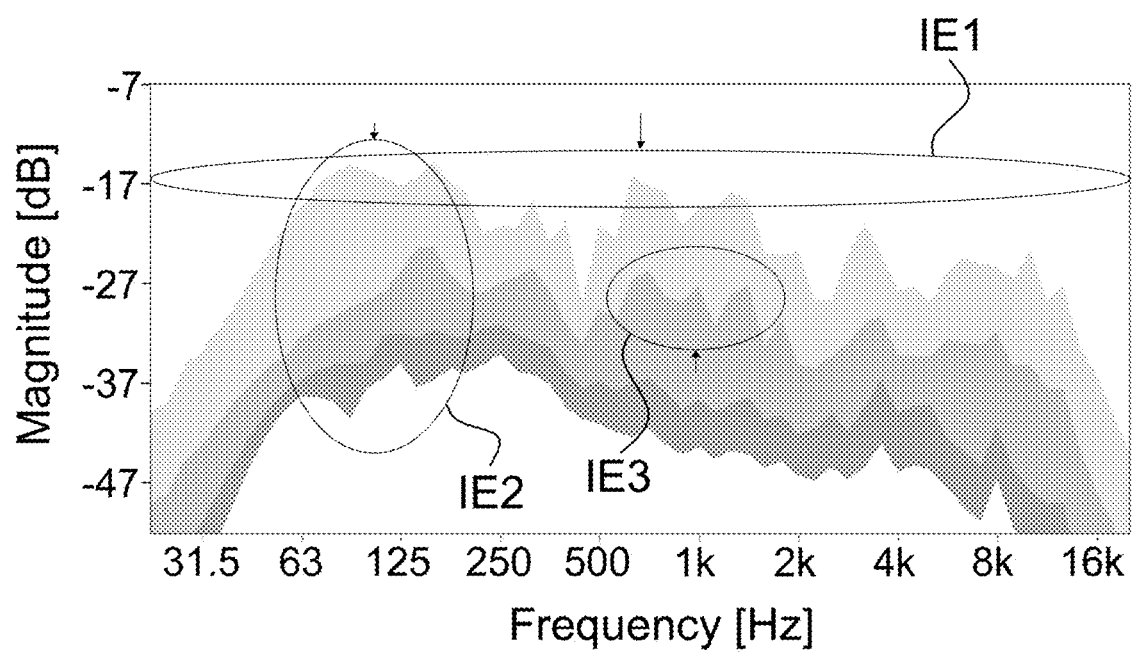

FIG. 21 illustrates a further example of a graphical representation according to the implementations described above with reference to FIGS. 18, 19 and 20. This graphical representation of SDCV of the audio signal AS resembles that of FIG. 19, but any of the above, or any other variations, of graphically representing the SDCV are within the scope of the implementation.

The graphical representation of FIG. 21 further comprises three interactive elements, IE1, IE2 and IE3. As described above, they are preferably mapped to specific audio effects of the effects processor. In the example of FIG. 21, the interactive element IE1 with No. 1 as processing type PT, may for example be associated with a dynamic compression effect, which is underlined by its shape, indicating that all frequencies—above a threshold level—will be affected by the processing. The downward arrow handle of IE1 may indicate the amount of compression that this effect applies. The interactive element IE2 may be associated with a parametric equalizer, analogous to IE1 of FIG. 20. Such effects will modify all levels—to some extent—within the requested bandwidth around the center frequency of the effect, as illustrated by the shape of IE2 in FIG. 21. Finally, the interactive element IE3 may be associated with a dual-threshold dynamic equalizer, which characteristically features both a lower and an upper threshold level, as indicated by the shape and location of IE3.

In an advanced implementation, the user may simultaneously indicate the type of effect and its overall parameters by placing and shaping a generic user interactive element, such as the 3 ellipses, IE1-3 of FIG. 21. The mapping to the specific effect may then be deduced by an algorithm choosing the effect which would be best suited to realizing the change to the SDCV indicated by the user.

The various implementations described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of analyzing and displaying spectral-dynamic properties of an audio signal and of a derived audio signal, which is derived from the audio signal, the method comprising:
    performing the following steps for each of the audio signal and the derived audio signal to calculate spectral-dynamic characterizing values associated with the audio signal and spectral-dynamic characterizing values associated with the derived audio signal, the steps including:
    measuring a level over time in multiple neighboring frequency-bands within a frequency range of 20 Hz to 20 kHz based on the audio signal;
    calculating spectral-dynamic characterizing values based on two or more statistics of a distribution of the levels, within each of the frequency-bands; and
    generating and displaying a graphical representation of the spectral-dynamic characterizing values as a function of frequency.

2. The method of claim 1, wherein the generating and displaying the graphical representation comprises generating and displaying a combined graphical representation that includes a representation of the spectral-dynamic characterizing values associated with the audio signal and a representation of the spectral-dynamic characterizing values associated with the derived audio signal.

3. The method of claim 1, wherein the generating and displaying the graphical representation comprises generating and displaying a difference representation, representing a difference between the spectral-dynamic characterizing values associated with the audio signal and the spectral-dynamic characterizing values associated with the derived audio signal.

4. The method of claim 3, wherein generating and displaying the combined graphical representation or the difference representation is based on minimizing a difference between the spectral-dynamic characterizing values associated with the audio signal and the spectral-dynamic characterizing values associated with the derived audio signal.

5. A method of analyzing and displaying spectral-dynamic properties of an audio signal, the method comprising:
   measuring a level over time in multiple neighboring frequency-bands within a frequency range of 20 Hz to 20 kHz based on the audio signal;
   calculating spectral-dynamic characterizing values based on two or more statistics of a distribution of the measured levels within each of the frequency-bands; and
   displaying a graphical representation of the spectral-dynamic characterizing values as a function of frequency, the graphical representation comprising an interactive representation that includes at least one user interactive element, wherein the at least one user interactive element is mapped to control one or more parameters of an audio processor in response to a user indicating via the at least one user interactive element a desired change of the graphical representation.

6. The method of claim 5, wherein the control of the one or more parameters of the audio processor is based on the mapping from the desired change to the one or more parameters of the audio processor, the mapping depending on the type of audio processing associated with the user interactive element.

7. The method of claim 5, further comprising generating a derived audio signal by processing the audio signal based on the one or more parameters of the audio processor, and updating the graphical representation on the basis of the derived audio signal.

8. The method of claim 7, wherein the graphical representation comprises a difference representation, representing a difference between the spectral-dynamic characterizing values associated with the audio signal and the spectral-dynamic characterizing values associated with the derived audio signal.

9. A method of analyzing and displaying spectral-dynamic properties of an audio signal, the method comprising:
   measuring a level over time in multiple neighboring frequency-bands within a frequency range of 20 Hz to 20 kHz based on the audio signal;
   calculating spectral-dynamic characterizing values based on two or more statistics of a distribution of said the measured levels within each of the frequency-bands; and
   generating for display a graphical representation of the spectral-dynamic characterizing values as a function of frequency.

10. The method of claim 9, wherein the multiple neighboring frequency-bands have essentially the same bandwidth in octaves.

11. The method of claim 9, wherein the multiple neighboring frequency-bands are based on a critical bandwidth.

12. The method of claim 9, wherein the two or more statistics of the distribution of the measured levels comprise one or more statistics selected from the list of:
   a minimum value;
   a maximum value;
   a minimum value above an estimated noise floor;
   a dB-mean value;
   a power-average value;
   a deviation from a mean or average value; and
   a value based on one or more parameters of a parametric probability-distribution fitted to the obtained levels.

13. The method of claim 9, wherein the two or more statistics of the distribution of the measured levels comprise two or more percentile values.

14. The method of any claim 9, wherein the two or more statistics of the distribution of the measured levels are based on a cumulative distribution function (CDF) of the distribution of the measured levels.

15. The method of claim 9, wherein the two or more statistics of the distribution of the measured levels are associated with a probability of occurrence of the measured levels in the audio signal in each of said the multiple neighboring frequency bands.

16. The method of claim 9, wherein the measuring a level in the multiple neighboring frequency-bands based on the audio signal includes using a subset of time-frames of the audio signal.

17. The method of claim 9, wherein the calculating the spectral-dynamic characterizing values is based on using two or more statistics of a subset of the measured levels in the distribution.

18. The method of claim 9, wherein the graphical representation is furthermore based on a loudness estimate of the audio signal, the loudness estimate being determined based on the measured levels in multiple frequency bands.

19. The method of claim 9, wherein the graphical representation further comprises an indication of a spectrum associated with a selected time of the audio signal.

20. A spectral-dynamics assessing unit for analyzing and displaying spectral-dynamic properties of an audio signal, the spectral-dynamics assessing unit comprising at least one audio input, a processing unit coupled to the at least one audio input, and a display coupled to the processing unit, the spectral-dynamics assessing unit arranged to receive at least one audio signal on the at least one audio input and carry out a method of analyzing and displaying spectral-dynamic properties of the at least one audio signal, the method comprising measuring a level over time in multiple neighboring frequency-bands within a frequency range of 20 Hz to 20 kHz based on the at least one audio signal; calculating spectral-dynamic characterizing values SDCV based on two or more statistics of a distribution of said the measured levels within each of the frequency-bands; and displaying a graphical representation of the spectral-dynamic characterizing values (SDCV) as a function of frequency.

* * * * *